United States Patent
Wang et al.

(10) Patent No.: US 9,054,126 B2
(45) Date of Patent: Jun. 9, 2015

(54) RECESSED SINGLE CRYSTALLINE SOURCE AND DRAIN FOR SEMICONDUCTOR-ON-INSULATOR DEVICES

(71) Applicant: International Business Machines Corporation, Armonk, NY (US)

(72) Inventors: Geng Wang, Stormville, NY (US); Kangguo Cheng, Guilderland, NY (US); Joseph Ervin, Wappingers Falls, NY (US); Chengwen Pei, Danbury, CT (US); Ravi M. Todi, San Diego, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 16 days.

(21) Appl. No.: 14/084,205

(22) Filed: Nov. 19, 2013

(65) Prior Publication Data

US 2014/0073092 A1    Mar. 13, 2014

Related U.S. Application Data

(62) Division of application No. 13/285,162, filed on Oct. 31, 2011, now Pat. No. 8,742,503.

(51) Int. Cl.
*H01L 27/12* (2006.01)
*H01L 29/66* (2006.01)
*H01L 21/84* (2006.01)

(52) U.S. Cl.
CPC .......... *H01L 29/66477* (2013.01); *H01L 21/84* (2013.01); *H01L 27/1203* (2013.01)

(58) Field of Classification Search
CPC .................................................. H01L 27/1203
USPC ............................................. 257/347, E27.112
See application file for complete search history.

(56) References Cited

U.S. PATENT DOCUMENTS 6,420,218 B1    7/2002    Yu
6,437,404 B1    8/2002    Xiang et al.
(Continued)

OTHER PUBLICATIONS

Mendez, M. et al., "Comparing SOI and Bulk FinFETs: Performance, Manufacturing Variability, and Cost" Solid State Technology (Nov. 2009) pp. 10, 12-15, vol. 52, No. 11.
Translucent, Inc. "Crystalline Rare Earth Oxide" 4 pages, downloaded Sep. 12, 2011, http://new.translucentinc.com/wp-content/uploads/2011/07/appnote_reo.pdf.
(Continued)

*Primary Examiner* — Amar Movva
(74) *Attorney, Agent, or Firm* — Scully, Scott, Murphy & Presser, P.C.; H. Daniel Schnurmann

(57) ABSTRACT

After formation of a gate stack, regions in which a source and a drain are to be formed are recessed through the top semiconductor layer and into an upper portion of a buried single crystalline rare earth oxide layer of a semiconductor-on-insulator (SOI) substrate so that a source trench and drain trench are formed. An embedded single crystalline semiconductor portion epitaxially aligned to the buried single crystalline rare earth oxide layer is formed in each of the source trench and the drain trench to form a recessed source and a recessed drain, respectively. Protrusion of the recessed source and recessed drain above the bottom surface of a gate dielectric can be minimized to reduce parasitic capacitive coupling with a gate electrode, while providing low source resistance and drain resistance through the increased thickness of the recessed source and recessed drain relative to the thickness of the top semiconductor layer.

15 Claims, 18 Drawing Sheets

(56) References Cited

U.S. PATENT DOCUMENTS

| | | |
|---|---|---|
| 6,657,252 B2 | 12/2003 | Fried et al. |
| 7,101,763 B1 | 9/2006 | Anderson et al. |
| 7,135,699 B1 | 11/2006 | Atanackovic |
| 7,183,152 B1 | 2/2007 | Dakshina-Murthy et al. |
| 7,452,758 B2 | 11/2008 | Dyer et al. |
| 7,655,327 B2 | 2/2010 | Atanackovic |
| 7,671,426 B2 | 3/2010 | Mise et al. |
| 7,709,826 B2 | 5/2010 | Atanackovic |
| 7,759,199 B2 | 7/2010 | Thomas et al. |
| 7,902,546 B2 | 3/2011 | Atanackovic |

OTHER PUBLICATIONS

Xu, X. et al., "High-Performance BOI FinFETs Based on Bulk-Silicon Substrate" IEEE Transactions on Electron Devices (Nov. 2008) pp. 3246-3250, vol. 55, No. 11.

Anwar, A. et al., "A Comparative Numerical Simulation of a Nanoscaled Body on Insulator FinFet" 27th International Conference on Microelectronics Proceedings (MIEL) (May 16-19, 2010) pp. 413-416.

Xhang, Z. et al., "Self-Align Recessed Source Drain Ultrathin Body SOI MOSFET" IEEE Electron Device Letters (Nov. 2004) pp. 740-742, vol. 25, No. 11.

RECESSED SINGLE CRYSTALLINE SOURCE AND DRAIN FOR SEMICONDUCTOR-ON-INSULATOR DEVICES

CROSS REFERENCE TO RELATED APPLICATION

This application is a divisional of U.S. patent application Ser. No. 13/285,162, filed Oct. 31, 2011 the entire content and disclosure of which is incorporated herein by reference.

BACKGROUND

The present disclosure relates to semiconductor structures, and particularly to semiconductor structures employing recessed single crystalline source and drain embedded in an upper portion of a buried single crystalline rare earth oxide layer of a semiconductor-on-insulator substrate, and methods of manufacturing the same.

High source resistance or high drain resistance adversely impacts the performance of a field effect transistor by limiting the on-current of the field effect transistor. Thus, devices formed on a semiconductor-on-insulator (SOI) substrate having a thin top semiconductor layer is prone to performance degradation due to reduction in thickness of the source and the drain. For extremely thin semiconductor-on-insulator (ETSOI) devices in which the top semiconductor layer has a thickness less than 30 nm, the problem of high source resistance and high drain resistance significantly degrades the on-current and the overall performance of the ETSOI devices.

BRIEF SUMMARY

A semiconductor-on-insulator (SOI) substrate including a buried single crystalline rare earth oxide layer is provided. The buried single crystalline rare earth oxide layer includes a single crystalline layer of an oxide of at least one rare earth element, and has a lattice constant that is compatible with epitaxial growth of a single crystalline semiconductor material thereupon. After formation of a gate stack on the top semiconductor layer of the SOI substrate, regions in which a source and a drain are to be formed are recessed through the top semiconductor layer and into an upper portion of the buried single crystalline rare earth oxide layer. A source trench and drain trench are formed by the recessing. An embedded single crystalline semiconductor portion epitaxially aligned to the underlying buried single crystalline rare earth oxide layer is formed in each of the source trench and the drain trench to form a recessed source region and a recessed drain region, respectively. Protrusion of the recessed source region and recessed drain region above the bottom surface of a gate dielectric can be minimized to reduce parasitic capacitive coupling with a gate electrode, while providing low source resistance and drain resistance through the increased thickness of the recessed source and recessed drain relative to the thickness of the top semiconductor layer.

According to an aspect of the present disclosure, a semiconductor structure is provided, which includes: a semiconductor substrate including a buried single crystalline rare earth oxide layer including a trench, the trench having a recessed surface that is recessed relative to a topmost surface of the buried single crystalline rare earth oxide layer and having sidewalls extending from the topmost surface to the recessed surface, a single crystalline semiconductor material region having a bottommost surface that is in contact with the topmost surface of the buried single crystalline rare earth oxide layer; and an embedded single crystalline semiconductor material region filling the trench, wherein a portion of the embedded single crystalline semiconductor material region is epitaxially aligned to a crystal structure of the buried single crystalline rare earth oxide layer, laterally contacts the single crystalline semiconductor material region.

According to another aspect of the present disclosure, a method of forming a semiconductor structure is provided, which includes: forming at least one trench through a top semiconductor layer and into an upper portion of a buried single crystalline rare earth oxide layer in a semiconductor substrate; and forming at least one embedded single crystalline semiconductor material region by filling each of the at least one trench with a single crystalline semiconductor material region that includes a portion that is epitaxially aligned to a crystal structure of the buried single crystalline rare earth oxide layer. Each of the at least one embedded single crystalline semiconductor material region laterally contacts a single crystalline semiconductor material region located within the top semiconductor layer.

DETAILED DESCRIPTION

Figure 1A:
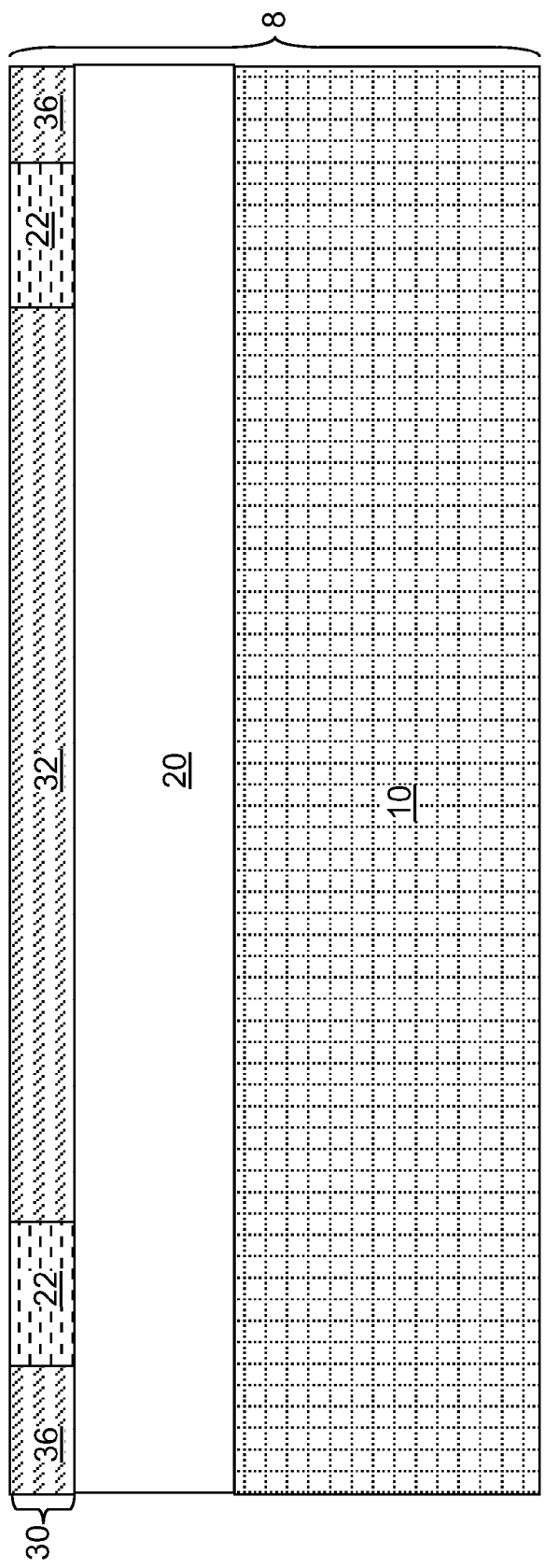
FIG. 1A is vertical cross-sectional view of a first exemplary semiconductor structure after formation of shallow trench isolation structures in a semiconductor-on-insulator (SOI) substrate including a buried single crystalline rare earth oxide layer according to a first embodiment of the present disclosure.

As stated above, the present disclosure relates to semiconductor structures employing recessed single crystalline source and drain embedded in an upper portion of a buried single crystalline rare earth oxide layer of a semiconductor-on-insulator substrate, and methods of manufacturing the same, which are now described in detail with accompanying figures Like and corresponding elements mentioned herein and illustrated in the drawings are referred to by like reference numerals. The drawings are not necessarily drawn to scale.

Figure 1B:
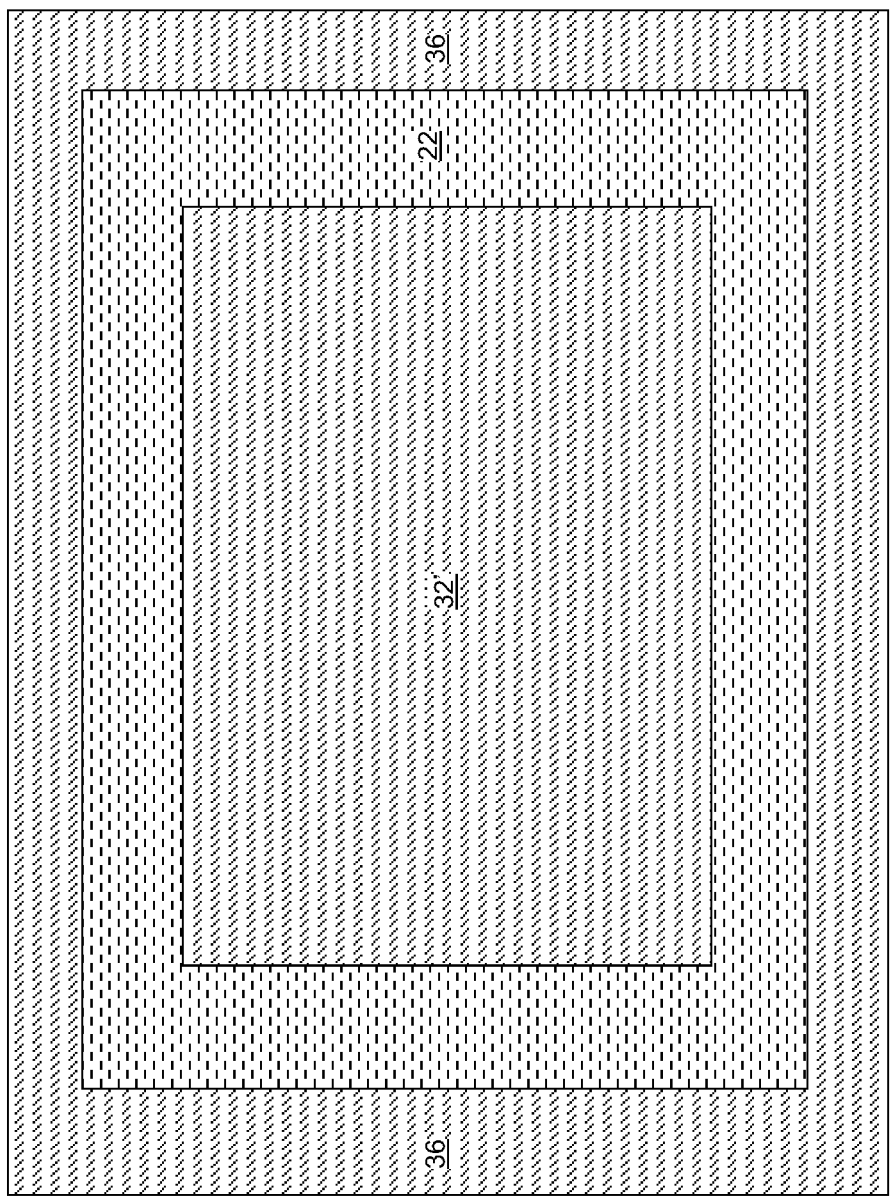
FIG. 1B is a top-down view of the first exemplary semiconductor structure of FIG. 1A.

Referring to FIGS. 1A and 1B, a first exemplary semiconductor structure according to a first embodiment of the present disclosure includes a semiconductor-on-insulator (SOI) substrate 8. The SOI substrate 8 includes a stack, from bottom to top, of a handle substrate 10, a buried single crystalline rare earth oxide layer 20, and a top semiconductor layer 30.

The handle substrate 10 provides structural support to, and prevents deformation or breakage of, the buried single crystalline rare earth oxide layer 20 and the top semiconductor layer 30. The thickness of the handle substrate 10 can be from 50 microns to 2 mm, although lesser and greater thicknesses can also be employed. The handle substrate 10 can include an amorphous, polycrystalline, or single crystalline semiconductor material, an insulator material, a conductor material, or a stack thereof.

The buried single crystalline rare earth oxide layer 20 includes a single crystalline rare earth oxide material. Method of forming a single crystalline rare oxide material is described, for example, in U.S. Pat. Nos. 7,655,327 and 7,709,826 to Atanackovic.

Rare earth elements are also referred to as Lanthanides, and include La, Ce, Pr, Nd, Pm, Sm, Eu, Gd, Tb, Dy, Ho, Er, Tm, Yb, and Lu. The ionic radii of rare earth elements decrease gradually with the atomic number, and the total variation of the ionic radii of rare earth elements is less than 15% among one another. The rare earth elements form various single crystalline dielectric oxides with a valance of +3, i.e., a dielectric oxide having a chemical formula of $M_2O_3$, in which M can be any of the rare earth elements.

Crystalline rare earth oxides are lattice coincident on a class of elemental or alloyed single crystalline semiconductor materials including single crystalline silicon, a single crystalline silicon-germanium alloy, a single crystalline silicon-carbon alloy, and a single crystalline silicon-germanium-carbon alloy. For each single crystalline $M_2O_3$ in which M is a rare earth element, at least one single crystalline semiconductor material having a lattice constant that is one half the lattice constant of the single crystalline $M_2O_3$ exists among single crystalline silicon, a single crystalline silicon-germanium alloy, a single crystalline silicon-carbon alloy, and a single crystalline silicon-germanium-carbon alloy.

For example, twice the lattice constant of silicon is between the lattice constant of gadolinium oxide ($Gd_2O_3$) and the lattice constant of neodymium oxide ($Nd_2O_3$). Thus, the composition of a single crystalline alloy of gadolinium oxide and neodymium oxide can be selected to match twice the lattice constant of silicon. In other words, the value x in the compound $Gd_{2-x}Nd_xO_3$ can be selected to provide a single crystalline compound having a lattice constant that is twice the lattice constant of silicon.

In another example, twice the lattice constant of germanium is between the lattice constant of praseodymium oxide ($Pd_2O_3$) and the lattice constant of lanthanum oxide ($La_2O_3$). Thus, the composition of a single crystalline alloy of praseodymium oxide and lanthanum oxide can be selected to match twice the lattice constant of germanium. In other words, the value y in the compound $Pd_{2-y}La_yO_3$ can be selected to provide a single crystalline compound having a lattice constant that is twice the lattice constant of silicon.

In a non-limiting exemplary embodiment, the buried single crystalline rare earth oxide layer 20 can include a single crystalline rare earth oxide selected from $Er_2O_3$, $Gd_2O_3$, $Nd_2O_3$, $Pr_2O_3$, $La_2O_3$, and a single crystalline alloy thereof.

In addition, crystalline rare earth oxides are lattice coincident on various single crystalline semiconductor materials that include III-V compound semiconductor materials and II-VI compound semiconductor materials. Thus, for each single crystalline $M_2O_3$ in which M is a rare earth element, at least one single crystalline compound semiconductor material having a lattice constant that is one half the lattice constant of the single crystalline $M_2O_3$ exists.

The thickness of the buried single crystalline rare earth oxide layer 20 can be from 25 nm to 300 nm, although lesser and greater thicknesses can also be employed. In one embodiment, the thickness of the buried single crystalline rare earth oxide layer 20 can be from 50 nm to 150 nm.

The top semiconductor layer 30 includes a single crystalline semiconductor material. The single crystalline semiconductor material of the top semiconductor layer 30 can be selected from, but is not limited to, silicon, a silicon germanium alloy, a silicon carbon alloy, a silicon germanium carbon ally, a III-V compound semiconductor material, a II-VI compound semiconductor material, and an alloy or a combination thereof.

The thickness of the top semiconductor layer 30 can be from 3 nm to 200 nm, although lesser and greater thicknesses can also be employed. In one embodiment, the SOI substrate 8 is an extremely thin semiconductor-on-insulator having a thickness from 3 nm to 15 nm.

The stack of the handle substrate 10, the buried single crystalline semiconductor layer, and the top semiconductor layer 30 can be formed, for example, by providing a semiconductor substrate including a single crystalline semiconductor layer having a same composition as the top semiconductor layer 30, forming a hydrogen-implanted layer in the single crystalline semiconductor layer at a depth equal to a desired thickness for the top semiconductor layer 30, depositing or bonding a layer of a single crystalline rare earth oxide material having a same thickness as a desired thickness for the top semiconductor layer 30, bonding the substrate including the hydrogen-implanted layer and the layer of the single crystalline rare earth oxide material to the handle substrate 10, and separating the bonded substrate along the hydrogen-implanted layer. Thus, the single crystalline semiconductor layer having the same composition as the top semiconductor layer 30 is incorporated as the top semiconductor layer 30 into the SOI substrate 8, and the layer of the single crystalline rare earth oxide material is incorporated into the SOI substrate 8 as the buried single crystalline rare earth oxide layer 20.

In one embodiment, prior to bonding with the handle substrate 8, the layer of the single crystalline rare earth oxide material that is subsequently incorporated the SOI substrate 8 can be formed with epitaxial alignment to the single crystalline semiconductor layer that is incorporated as the top semiconductor layer 30 into the SOI substrate 8. For example, the layer of the single crystalline rare earth oxide material can be formed by epitaxy of the single crystalline rare earth oxide material directly on the semiconductor surface of the single crystalline semiconductor layer. In this embodiment, the single crystalline semiconductor material of the top semiconductor layer 10 is in epitaxial alignment with the single crystalline insulator material of the buried single crystalline rare earth oxide layer 20.

In another embodiment, prior to bonding with the handle substrate 8, the layer of the single crystalline rare earth oxide material that is subsequently incorporated the SOI substrate 8 can be formed without epitaxial alignment to the single crystalline semiconductor layer that is incorporated as the top semiconductor layer 30 into the SOI substrate 8. For example, the layer of the single crystalline rare earth oxide material can be formed by bonding the layer of the single crystalline rare earth oxide material directly on the semiconductor surface of the single crystalline semiconductor layer. In this embodiment, the single crystalline semiconductor material of the top semiconductor layer 10 is not in epitaxial alignment with the single crystalline insulator material of the buried single crystalline rare earth oxide layer 20.

A shallow trench isolation structure 22 can be formed in the top semiconductor layer 30 by forming a shallow trench extending from the top surface of the top semiconductor layer 30 at least to the bottom surface of the top semiconductor layer 30, and subsequently filling the shallow trench with a dielectric material such as silicon oxide, silicon nitride, and/or silicon oxynitride. Excess dielectric material above the top surface of the top semiconductor layer 30 is removed, for example, by planarization such as chemical mechanical planarization (CMP).

The shallow trench isolation structure 22 can laterally surround, and electrically isolate, a contiguous single crystalline semiconductor material region 32' from other single crystalline semiconductor material regions 36 located within the top semiconductor layer 30. In other words, the contiguous single crystalline semiconductor material region 32' can be laterally spaced from the other single crystalline semiconductor material regions 36 by the shallow trench isolation structure 22.

The contiguous single crystalline semiconductor material region 32' has a bottommost surface that is in contact with the topmost surface of the buried single crystalline rare earth oxide layer 20. The shallow trench isolation structure 22 contacts the topmost surface of the buried single crystalline rare earth oxide layer 20 and laterally surrounds the contiguous single crystalline semiconductor material region 32'.

Figure 2A:
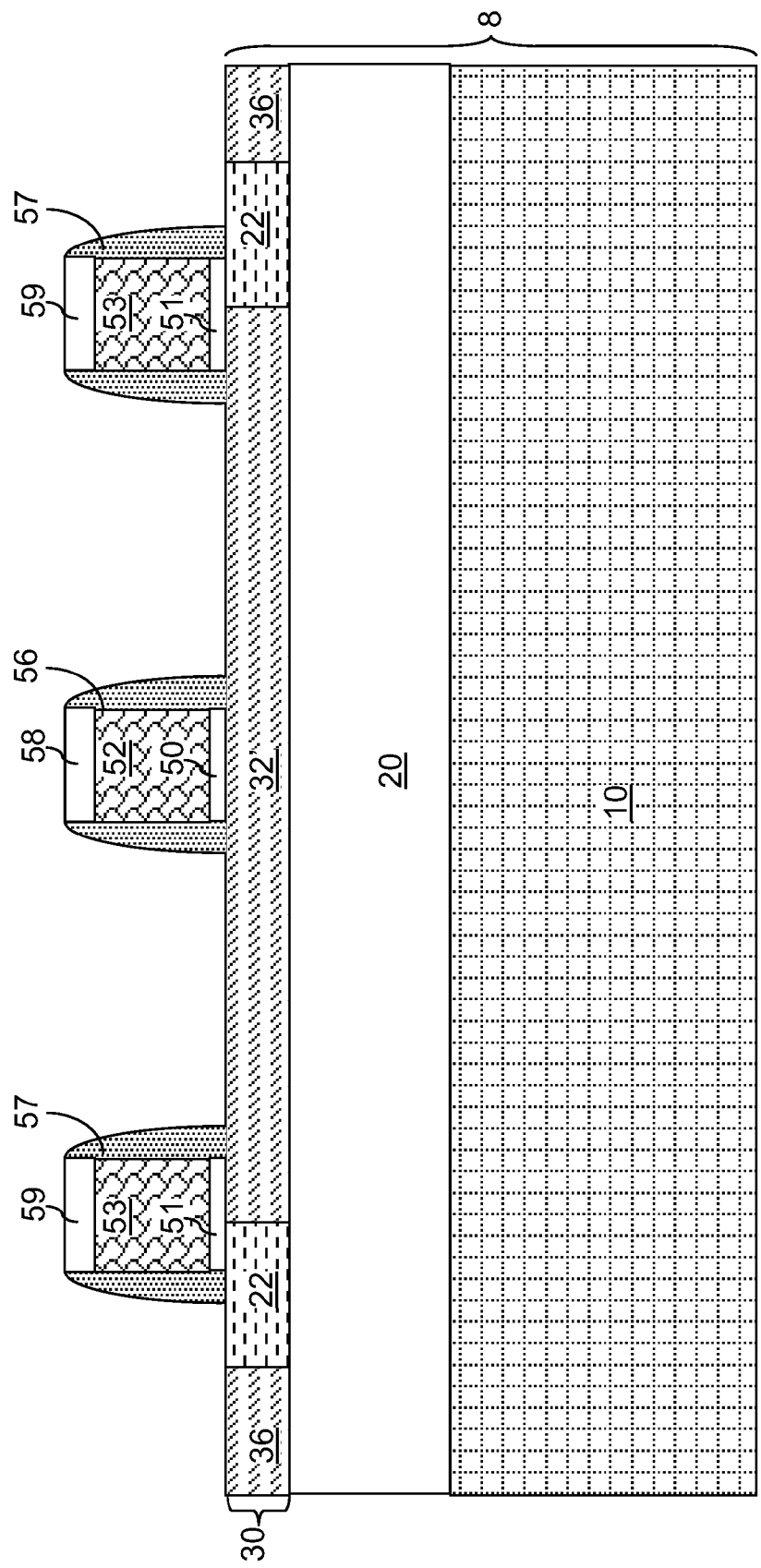
FIG. 2A is vertical cross-sectional view of the first exemplary semiconductor structure after formation of a gate stack, dummy gate stacks, a gate spacer, and dummy gate spacers according to the first embodiment of the present disclosure.
Figure 2B:
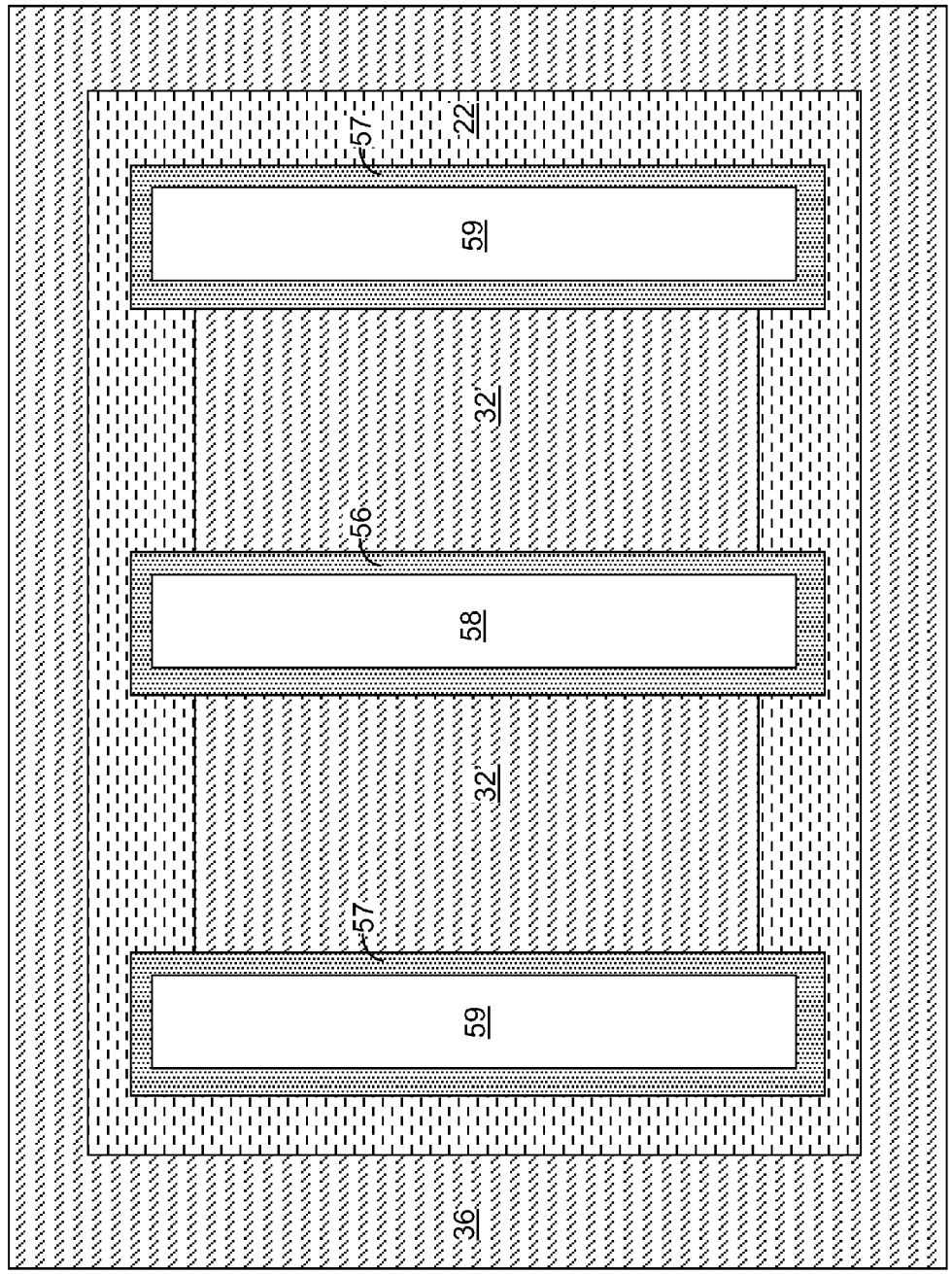
FIG. 2B is a top-down view of the first exemplary semiconductor structure of FIG. 2A.

Referring to FIGS. 2A and 2B, a gate dielectric layer, a gate conductor layer, and a gate cap dielectric layer are sequentially deposited and lithographically patterned to form a gate stack and at least one dummy gate stack. The gate stack includes a gate dielectric 50, a gate electrode 52, and a gate cap dielectric 58. Each of the at least one dummy gate stack includes a dummy gate dielectric 51, a dummy gate electrode 53, and a dummy gate cap dielectric 59.

Specifically, the gate dielectric layer can include a silicon oxide-based gate dielectric material, which can be, for example, silicon oxide, silicon oxynitride, or a dielectric stack including silicon nitride and at least one of silicon oxide and silicon oxynitride. Additionally or alternatively, the gate dielectric layer can include a high dielectric constant (high-k) material layer having a dielectric constant greater than 8.0. Exemplary dielectric materials having a dielectric constant greater than 8.0 include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the gate dielectric layer can be from 0.9 nm to 6 nm, and preferably from 1.0 nm to 3 nm. The gate dielectric layer may have an effective oxide thickness on the order of or less than 1 nm.

The gate conductor layer includes at least one conductive material. The at least one conductive material can include a doped semiconductor material and/or a metallic material. The doped semiconductor material may be deposited as an intrinsic semiconductor material and subsequently doped by implantation of electrical dopants such as B, Ga, In, P, As, and/or Sb, or can be in-situ doped during deposition. The doped semiconductor material can be deposited as an amorphous material and is converted into a polycrystalline material in subsequent high temperature processing steps, or can be deposited as a polycrystalline material. The metallic material may, or may not, include at least one work function metallic material that is employed to adjust the threshold voltage of a field effect transistor to be subsequently formed. The metallic material can include a high-conductivity metallic material such as W, Al, and/or alloys thereof. The material(s) of the gate conductor layer can be deposited by methods well known in the art including, for example, chemical vapor deposition (CVD), physical vapor deposition (PVD), atomic layer deposition (ALD), etc. The thickness of the gate conductor layer as deposited can be the same as the target thickness for a gate electrode to be subsequently formed, and can be from 30 nm to 300 nm, although lesser and greater thicknesses can also be employed.

The gate cap dielectric layer includes a dielectric material such as silicon oxide, silicon nitride, or silicon oxynitride. The gate cap dielectric layer can be deposited, for example, by chemical vapor deposition. The thickness of the gate cap dielectric layer can be from 10 nm to 60 nm, although lesser and greater thicknesses can also be employed.

The stack of the gate dielectric layer and the gate conductor layer is subsequently patterned, for example, by applying a photoresist thereupon, lithographically patterning the photoresist, and transferring the pattern in the photoresist into the underlying stack of the gate conductor layer and the gate dielectric layer employing an anisotropic etch that uses the patterned photoresist as an etch mask. The top semiconductor layer 30 can be the etch stop layer for the anisotropic etch. Remaining portions of the gate cap dielectric layer after the anisotropic etch include the gate cap dielectric 58 and the at least one dummy gate cap dielectric 59. Remaining portions of the gate conductor layer after the anisotropic etch include the gate electrode 52 and the at least one dummy gate electrode 53. Remaining portions of the gate dielectric layer after the anisotropic etch include the gate dielectric 50 and the at least one dummy gate dielectric 51.

At least one contact via structure (See FIGS. 5A and 5B) is subsequently formed on the gate electrode 52 so that the gate electrode 52 can be electrically biased during the operation of a field effect transistor to be formed. The gate dielectric 50 underlies the gate electrode 52. The at least one dummy gate electrode 53 is not contacted by a contact via structure in subsequent processing steps. Each of the at least one dummy gate dielectric 51 underlies one of the at least one dummy gate electrode 53. The gate dielectric 50 and the at least one dummy gate dielectric 51 include the same material(s) and have the same thickness. The gate electrode 52 and the at least one dummy gate electrode 52 include the same material(s) and have the same thickness.

Optionally, the portions of the contiguous single crystalline semiconductor material region 32' that are not covered by the gate stack (50, 52) or the at least one dummy gate stack (51, 53) can be doped by ion implantation of electrical dopants such as B, Ga, In, P, As, and/or Sb to form source and drain extension regions. Alternatively, the contiguous single crystalline semiconductor material region 32' can remain undoped, or can have the same type and concentration of electrical dopants as originally provided at the time of formation of the SOI substrate 8 prior to formation of the shallow trench isolation structure 22.

The gate stack (50, 52) can straddle over a middle portion of the contiguous single crystalline semiconductor material region 32'. Each of the at least one dummy gate stack (51, 53) can overlie an interface between the shallow trench isolation structure 22 and the contiguous single crystalline semiconductor material region 32'.

A dielectric material layer can be conformally deposited on the top surface of the top semiconductor layer 30 and exposed surfaces of the gate stack (50, 52) and the at least one dummy gate stack (52, 53). The dielectric material layer is anisotropically etched by an anisotropic etch, which can be, for example, a reactive ion etch. Horizontal portions of the dielectric material layer are removed by the anisotropic etch. Remaining vertical portions of the dielectric material layer laterally contact the sidewalls of, and laterally encloses, each of the gate stack (50, 52) and the at least one dummy gate stack (51, 53). The remaining portions of the dielectric material layer that contact the sidewalls of the gate stack (50, 52) constitute gate spacers 56. The remaining portions of the dielectric material layer that contact the sidewalls of each of the at least one dummy gate stack (51, 53) constitute at least one dummy gate spacer 57.

Figure 3A:
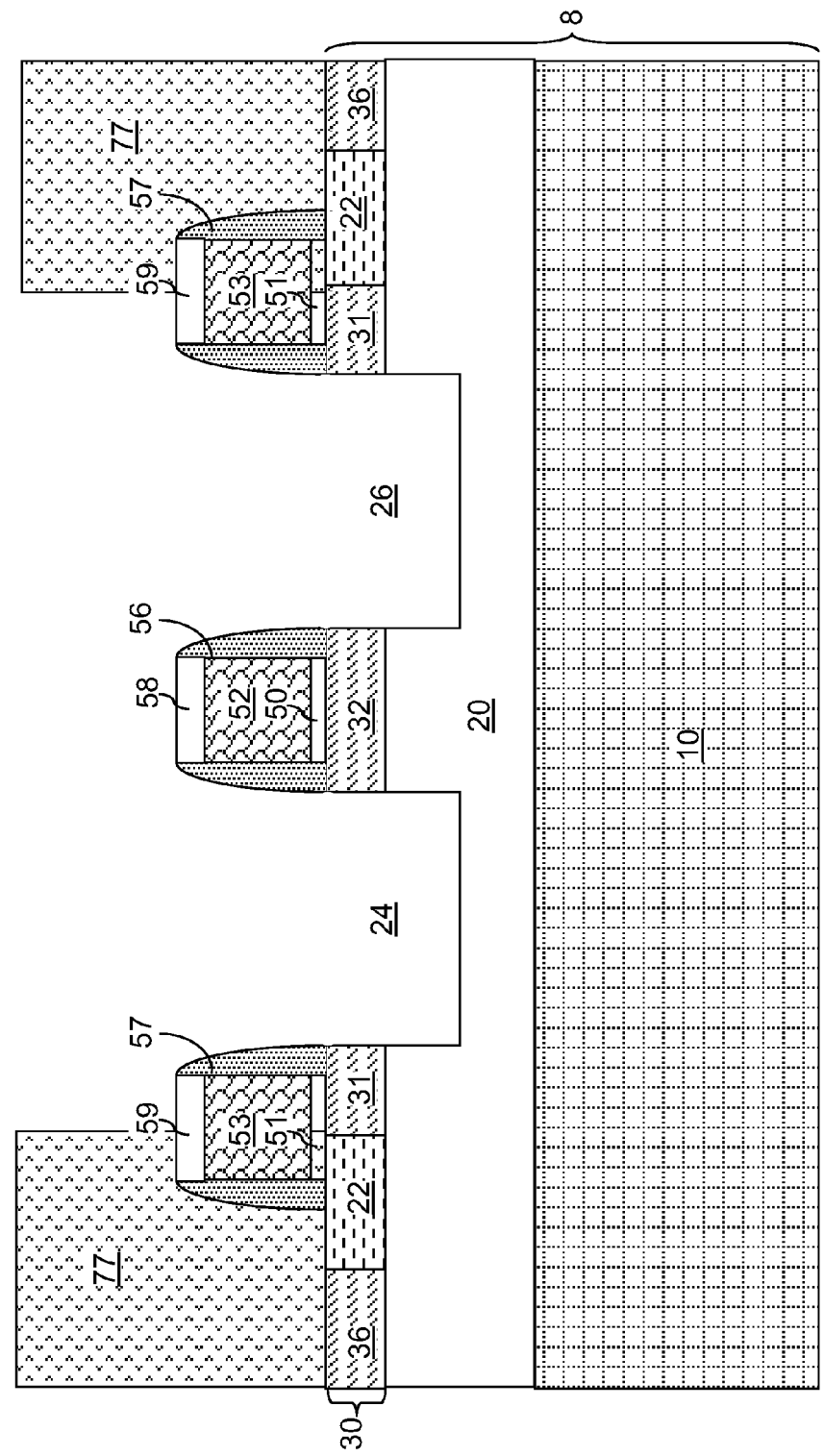
FIG. 3A is a vertical cross-sectional view of the first exemplary semiconductor structure after forming a source trench and a drain trench by etching portions of a top semiconductor layer and an upper portion of the buried single crystalline rare earth oxide layer that are not covered by the combination of the gate stack, the dummy gate stacks, the gate spacer, the dummy gate spacers, and a patterned photoresist according to the first embodiment of the present disclosure.
Figure 3B:
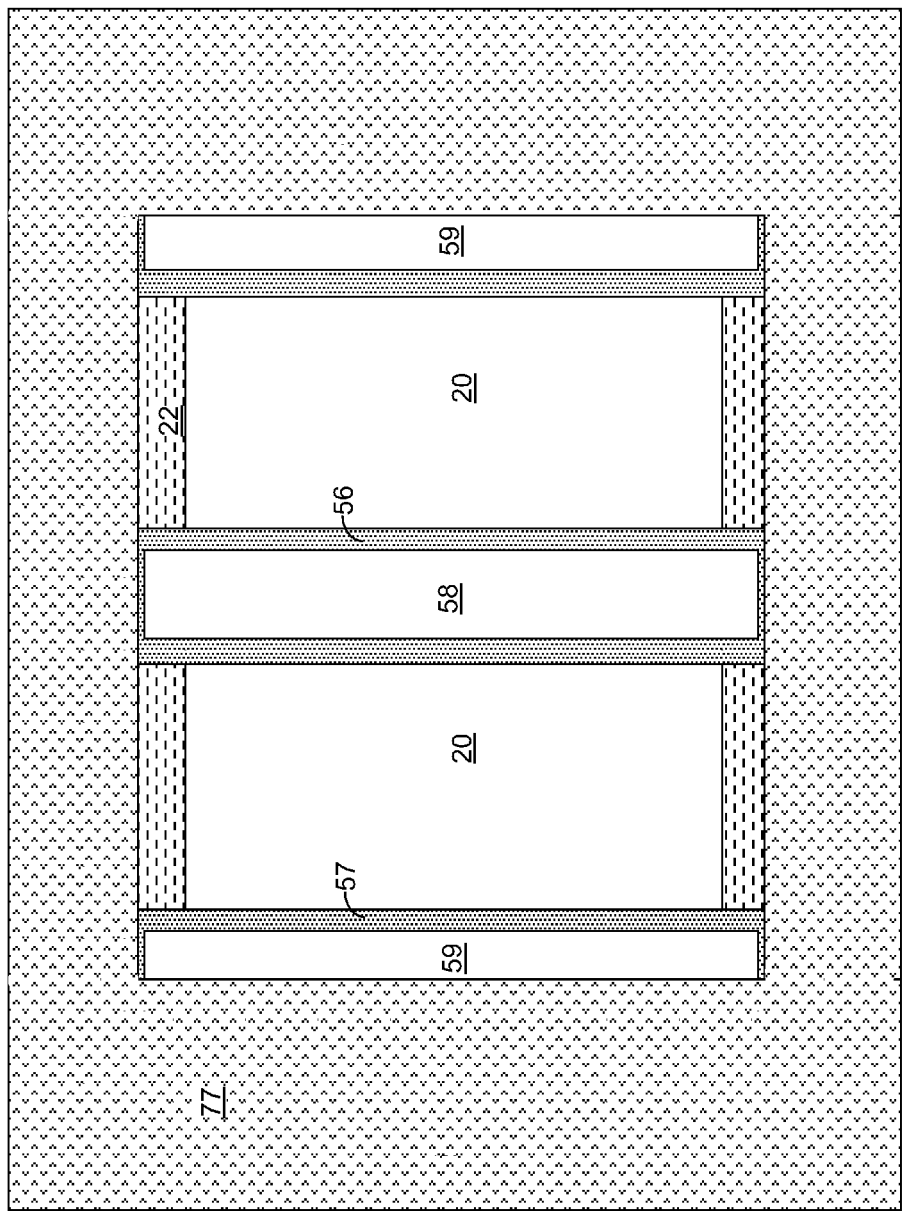
FIG. 3B is a top-down view of the first exemplary semiconductor structure of FIG. 3A.

Referring to FIGS. 3A and 3B, a photoresist 77 is applied over the SOI substrate 8, the gate stack (50, 52), the at least one dummy gate stack (51, 53), the gate spacer 56, and the at least one dummy gate spacer 57. The photoresist 77 is lithographically patterned so that a first area of the SOI substrate 8 is not covered by the photoresist 77 after exposure and development on one side (which is herein referred to as a "source-side") of the gate stack (50, 52), and a second area of the SOI substrate 8 is not covered by the photoresist 77 after exposure and development on the opposite side (which is herein referred to as a "drain-side") of the gate stack (50, 52).

The photoresist 77 can be lithographically patterned to have an edge that overlies a dummy gate stack (51, 53) located on a source side, i.e., a source-side dummy gate stack (51, 53), and another edge that overlies a dummy gate stack (51, 53) located on a drain side, i.e., a drain-side dummy gate stack (51, 53). In one embodiment, a physically exposed source-side area of the contiguous single crystalline semiconductor material region 32' can be laterally bounded by an outer sidewall of the gate spacer 56 and an outer sidewall of one of the at least one dummy gate spacer 57. A physically exposed drain-side area of the contiguous single crystalline semiconductor material region 32' can be laterally bounded by another outer sidewall of the gate spacer 56 and an outer sidewall of another of the at least one dummy gate spacer 57.

An anisotropic etch is performed employing the combination of the photoresist 77, the gate stack (50, 52), the at least one dummy gate stack (51, 53), the gate spacer 56, and the at least one dummy gate spacer 57 as an etch mask. A source trench 24 is formed by removing an entirety of the contiguous single crystalline semiconductor material region 32' and an upper portion of the buried single crystalline rare earth oxide layer 20 that are located on the source side and not protected by the etch mask including that combination of the photoresist 77, the gate stack (50, 52), the at least one dummy gate stack (51, 53), the gate spacer 56, and the at least one dummy gate spacer 57. A drain trench 26 is formed by removing an entirety of the contiguous single crystalline semiconductor material region 32' and an upper portion of the buried single crystalline rare earth oxide layer 20 that are located on the drain side and not protected by the etch mask including that combination of the photoresist 77, the gate stack (50, 52), the at least one dummy gate stack (51, 53), the gate spacer 56, and the at least one dummy gate spacer 57.

Thus, each of the source trench 24 and the drain trench 26 is formed through the top semiconductor layer 30 and into an upper portion of the buried single crystalline rare earth oxide layer 20. Each of the source trench 24 and the drain trench 26 has a trench bottom surface, which is a recessed horizontal surface that is recessed relative to a topmost surface of the buried single crystalline rare earth oxide layer 20. Each of the source trench 24 and the drain trench 26 has sidewalls extending from the topmost surface of the buried single crystalline rare earth oxide layer 20 to the recessed horizontal surface. The recessed horizontal surface, i.e., the bottom surface, of the source trench 24 can be coplanar with the recessed horizontal surface of the drain trench 26.

One sidewall of the source trench 24 is vertically coincident, i.e., coincide in a top down view in a vertical direction (which is the direction perpendicular to the topmost surface of the top semiconductor layer 30), with an outer sidewall of the gate spacer 56 that is located on the source side. Another sidewall of the source trench 24 can be vertically coincident with an outer sidewall of a dummy gate spacer 57 located on the source side. One sidewall of the drain trench 26 is vertically coincident with an outer sidewall of the gate spacer 56 that is located on the drain side. Another sidewall of the drain trench 26 can be vertically coincident with an outer sidewall of a dummy gate spacer 57 located on the drain side.

The remaining portion of the contiguous single crystalline semiconductor material region 32' underlying the gate stack (50, 52) and the gate spacer 56 and located between the source trench 24 and the drain trench 26 is herein referred to as a first single crystalline semiconductor material region 32. The at least one remaining portion of the contiguous single crystalline semiconductor material region 32' that underlie the at least one dummy gate stack (51, 53) and the at least one dummy gate spacer 57 and is located farther away laterally from the gate stack (50, 52) than the source trench 24 or the drain trench 26 is herein referred to as at least one second single crystalline semiconductor material portion 31. The at least one second single crystalline semiconductor material portion 31 laterally contacts the shallow trench isolation structure 22.

Figure 4A:
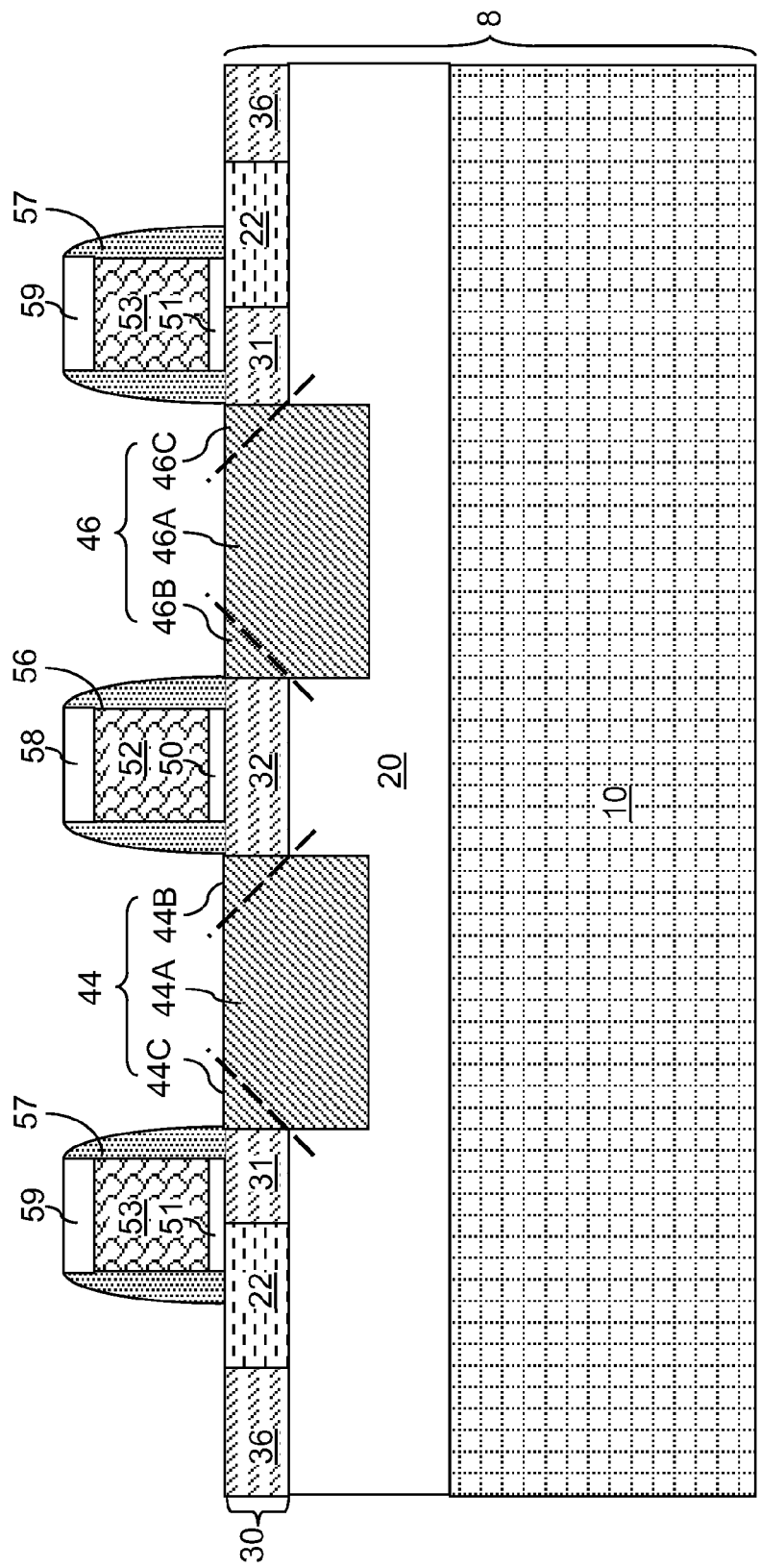
FIG. 4A is a vertical cross-sectional view of the first exemplary semiconductor structure after removing the overlying polycrystalline semiconductor layer and portions of the embedded epitaxial semiconductor portions above the topmost surface of the top semiconductor layer according to the first embodiment of the present disclosure.
Figure 4B:
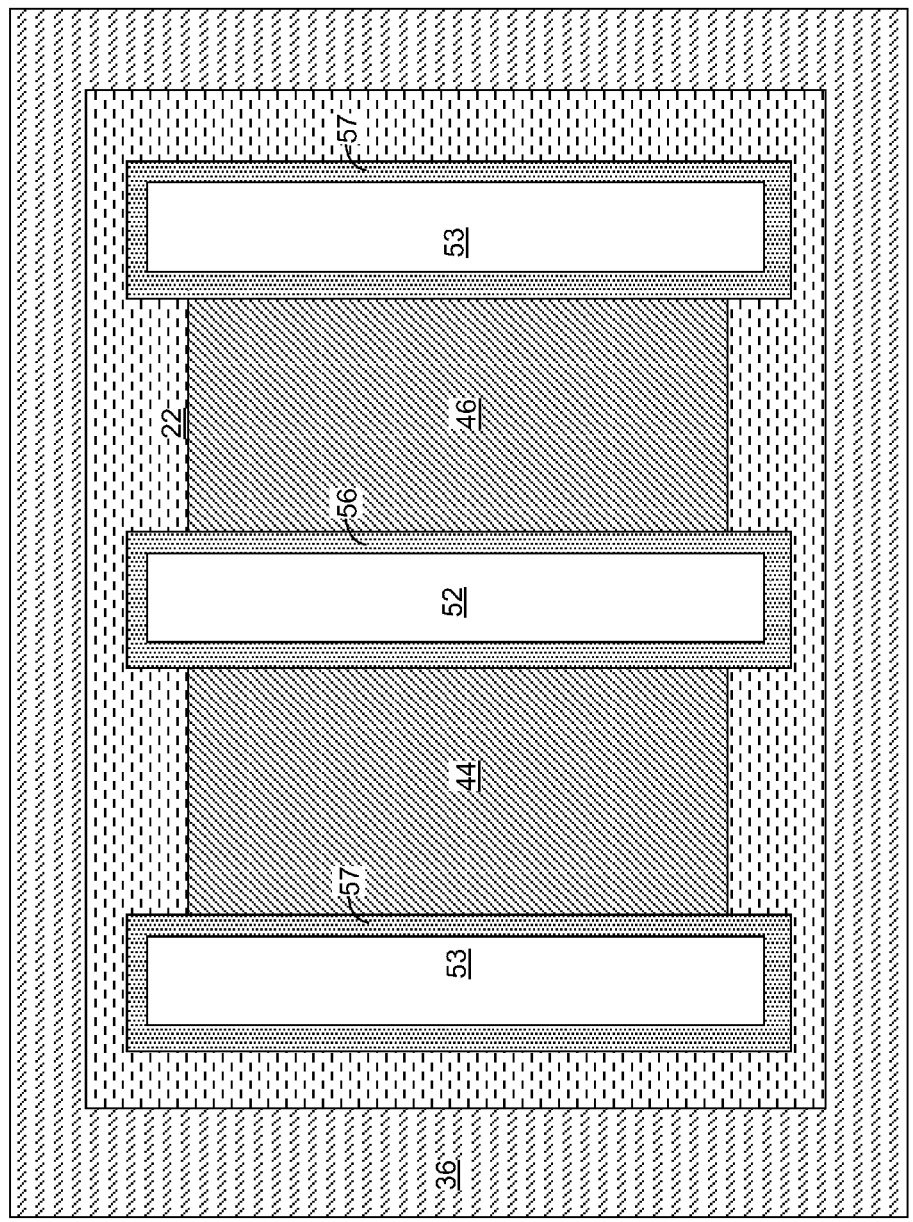
FIG. 4B is a top-down view of the first exemplary semiconductor structure of FIG. 4A.

Referring to FIGS. 4A and 4B, a semiconductor material is selectively deposited within the source trench 24 and with the drain trench 26. The deposition of the semiconductor material can be effected, for example, by a selective epitaxy process. During the selective deposition of the semiconductor material, the semiconductor material is deposited on semiconductor surfaces, and is not deposited on dielectric surfaces such as the surfaces of the gate spacers 56, the gate cap dielectric 58, the at least one dummy gate cap dielectric 59, and the shallow trench isolation structure 22. A single crystalline semiconductor material is deposited on exposed single crystalline surfaces of the buried single crystalline rare earth oxide layer 20 and exposed single crystalline surfaces of the first single crystalline semiconductor material region 32 and the at least one second single crystalline semiconductor material portion 31. Specifically, the single crystalline semiconductor material is deposited on the entirety of the sidewalls of the source trench 24, the entirety of the sidewalls of the drain trench 26, the entirety of the bottom surface of the source trench 24, and the entirety of the bottom surface of the drain trench 26.

In a selective semiconductor material deposition process, an etchant gas such as HCl is flowed into a processing chamber concurrently with, or alternately with, reactant gas such as $SiH_4$, $SiH_2Cl_2$, $SiHCl_3$, $SiCl_4$, $Si_2H_6$, $GeH_4$, $Ge_2H_6$, $C_2H_2$, $C_2H_4$, or other precursors for semiconductor material deposition. The flow rate of the etchant is set such that the etch rate in the selective semiconductor material deposition process is greater than the deposition rate of a polycrystalline semiconductor material on surfaces of the gate electrode 52, the at least one dummy gate electrode 53, the gate spacer 56, and the at least one dummy gate spacer 57 and lesser than the deposition rate of a single crystalline semiconductor material on the sidewalls of the source trench 24 and the drain trench 26. It is noted that the deposition rate of a single crystalline semiconductor material is greater than the deposition rate of a polycrystalline semiconductor material having the same composition.

A first source-side embedded epitaxial semiconductor portion 44A grows from the exposed surfaces of the buried single crystalline rare earth oxide layer 20 within the source trench 24 in epitaxial alignment with the crystal structure of the buried single crystalline rare earth oxide layer 20. A second source-side embedded epitaxial semiconductor portion 44B grows from the sidewall of the first single crystalline semiconductor material region 32 on the source side in epitaxial alignment with the crystal structure of the first single crystalline semiconductor material region 32. A third source-side embedded epitaxial semiconductor portion 44C can grow from a sidewall of a second single crystalline semiconductor material region 31 on the source side in epitaxial alignment with that second single crystalline semiconductor material region 31. The first source-side embedded epitaxial semiconductor portion 44A, the second source-side embedded epitaxial semiconductor portion 44B, and the third source-side embedded epitaxial semiconductor portion 44C collectively constitute a source-side embedded single crystalline semiconductor material region 44.

If the first single crystalline semiconductor material region 32 and the second single crystalline semiconductor material region 31 on the source side are epitaxially aligned to the crystal structure of the buried single crystalline rare earth oxide layer 20, the entirety of the source-side embedded single crystalline semiconductor material region 44 is a single crystal. If the first single crystalline semiconductor material region 32 and the second single crystalline semiconductor material region 31 on the source side are not epitaxially aligned to the crystal structure of the buried single crystalline rare earth oxide layer 20, dislocations boundaries can exist among the first source-side embedded epitaxial semiconductor portion 44A, the second source-side embedded epitaxial semiconductor portion 44B, and the third source-side embedded epitaxial semiconductor portion 44C. The dislocation boundaries are indicated with dotted lines in FIG. 4A.

A first drain-side embedded epitaxial semiconductor portion 46A grows from the exposed surfaces of the buried single crystalline rare earth oxide layer 20 within the drain trench 26 in epitaxial alignment with the crystal structure of the buried single crystalline rare earth oxide layer 20. A second drain-side embedded epitaxial semiconductor portion 46B grows from the sidewall of the first single crystalline semiconductor material region 32 on the drain side in epitaxial alignment with the crystal structure of the first single crystalline semiconductor material region 32. A third drain-side embedded epitaxial semiconductor portion 46C can grow from a sidewall of a second single crystalline semiconductor material region 31 on the drain side in epitaxial alignment with that second single crystalline semiconductor material region 31. The first drain-side embedded epitaxial semiconductor portion 46A, the second drain-side embedded epitaxial semiconductor portion 46B, and the third drain-side embedded epitaxial semiconductor portion 46C collectively constitute a drain-side embedded single crystalline semiconductor material region 36.

If the first single crystalline semiconductor material region 32 and the second single crystalline semiconductor material region 31 on the drain side are epitaxially aligned to the crystal structure of the buried single crystalline rare earth oxide layer 20, the entirety of the drain-side embedded single crystalline semiconductor material region 46 is a single crystal. If the first single crystalline semiconductor material region 32 and the second single crystalline semiconductor material region 31 on the drain side are not epitaxially aligned to the crystal structure of the buried single crystalline rare earth oxide layer 20, dislocations boundaries can exist among the first drain-side embedded epitaxial semiconductor portion 46A, the second drain-side embedded epitaxial semiconductor portion 46B, and the third drain-side embedded epitaxial semiconductor portion 46C. The dislocation boundaries are indicated with dotted lines in FIG. 4A.

The semiconductor material of the source-side embedded single crystalline semiconductor material region 44 and the drain-side embedded single crystalline semiconductor material region 46 can have the same composition throughout. The semiconductor material of the source-side embedded single crystalline semiconductor material region 44 and the drain-side embedded single crystalline semiconductor material region 46 can be in-situ doped with electrical dopants such as B, Ga, In, P, As, and Sb, or intrinsic. The semiconductor material of the source-side embedded single crystalline semiconductor material region 44 and the drain-side embedded single crystalline semiconductor material region 36 can be selected from, but is not limited to, silicon, a silicon germanium alloy, a silicon carbon alloy, a silicon germanium carbon ally, a III-V compound semiconductor material, a II-VI compound semiconductor material, and an alloy or a combination thereof. The semiconductor material of the source-side embedded single crystalline semiconductor material region 44 and the drain-side embedded single crystalline semiconductor material region 46 can be the same as, or different from, the semiconductor material of the first single crystalline semiconductor material region 32 and the at least one second single crystalline semiconductor material region 31. In one embodiment, the semiconductor material of the source-side embedded single crystalline semiconductor material region 44 and the drain-side embedded single crystalline semiconductor material region 46 can be a silicon-germanium alloy or a silicon-carbon alloy, and the semiconductor material of the first single crystalline semiconductor material region 32 and the at least one second single crystalline semiconductor material region 31 can be silicon.

A vertical interface between the second source-side embedded epitaxial semiconductor portion 44B and the first single crystalline semiconductor material region 32 is vertically coincident with a sidewall of the first source-side embedded epitaxial semiconductor portion 44A and an outer sidewall of the gate spacer 56 on the source side. A vertical interface between the third source-side embedded epitaxial semiconductor portion 44C and the second single crystalline semiconductor material portion 31 on the source side is vertically coincident with another sidewall of the first source-side embedded epitaxial semiconductor portion 44A and an outer sidewall of a dummy gate spacer 57 on the source side.

A vertical interface between the second drain-side embedded epitaxial semiconductor portion 46B and the first single crystalline semiconductor material region 32 is vertically coincident with a sidewall of the first drain-side embedded epitaxial semiconductor portion 46A and an outer sidewall of the gate spacer 56 on the drain side. A vertical interface between the third drain-side embedded epitaxial semiconductor portion 46C and the second single crystalline semiconductor material portion 31 on the drain side is vertically coincident with another sidewall of the first drain-side embedded epitaxial semiconductor portion 46A and an outer sidewall of a dummy gate spacer 57 on the drain side.

The top surfaces of the first source-side embedded epitaxial semiconductor portion 44A, the second source-side embedded epitaxial semiconductor portion 44B, and the third source-side embedded epitaxial semiconductor portion 44C can be coplanar with, located above, or located below, the interface between the gate dielectric 50 and the first single crystalline semiconductor material portion 32. The source-side embedded single crystalline semiconductor material region 44 is a source region of a field effect transistor within the first exemplary semiconductor structure.

The top surfaces of the first drain-side embedded epitaxial semiconductor portion 46A, the second drain-side embedded epitaxial semiconductor portion 46B, and the third drain-side embedded epitaxial semiconductor portion 46C can be coplanar with, located above, or located below, the interface between the gate dielectric 50 and the first single crystalline semiconductor material portion 32. The drain-side embedded single crystalline semiconductor material region 46 is a drain region of the field effect transistor within the first exemplary semiconductor structure.

If the source-side embedded single crystalline semiconductor material region 44 and the drain-side embedded single crystalline semiconductor material region 46 are intrinsic or has a dopant concentration less than a target dopant concentration, additional electrical dopants such as B, Ga, In, P, As, and/or Sb can be implanted to increase the dopant concentration of the electrical dopants in the source-side embedded single crystalline semiconductor material region 44 and the drain-side embedded single crystalline semiconductor material region 46. In one embodiment, the dopant concentration in the source-side embedded single crystalline semiconductor material region 44 and the drain-side embedded single crystalline semiconductor material region 46 can be from $5.0 \times 10^{19}/cm^3$ to $2.0 \times 10^{21}/cm^3$, although lesser and greater dopant concentrations can also be employed.

Figure 5A:
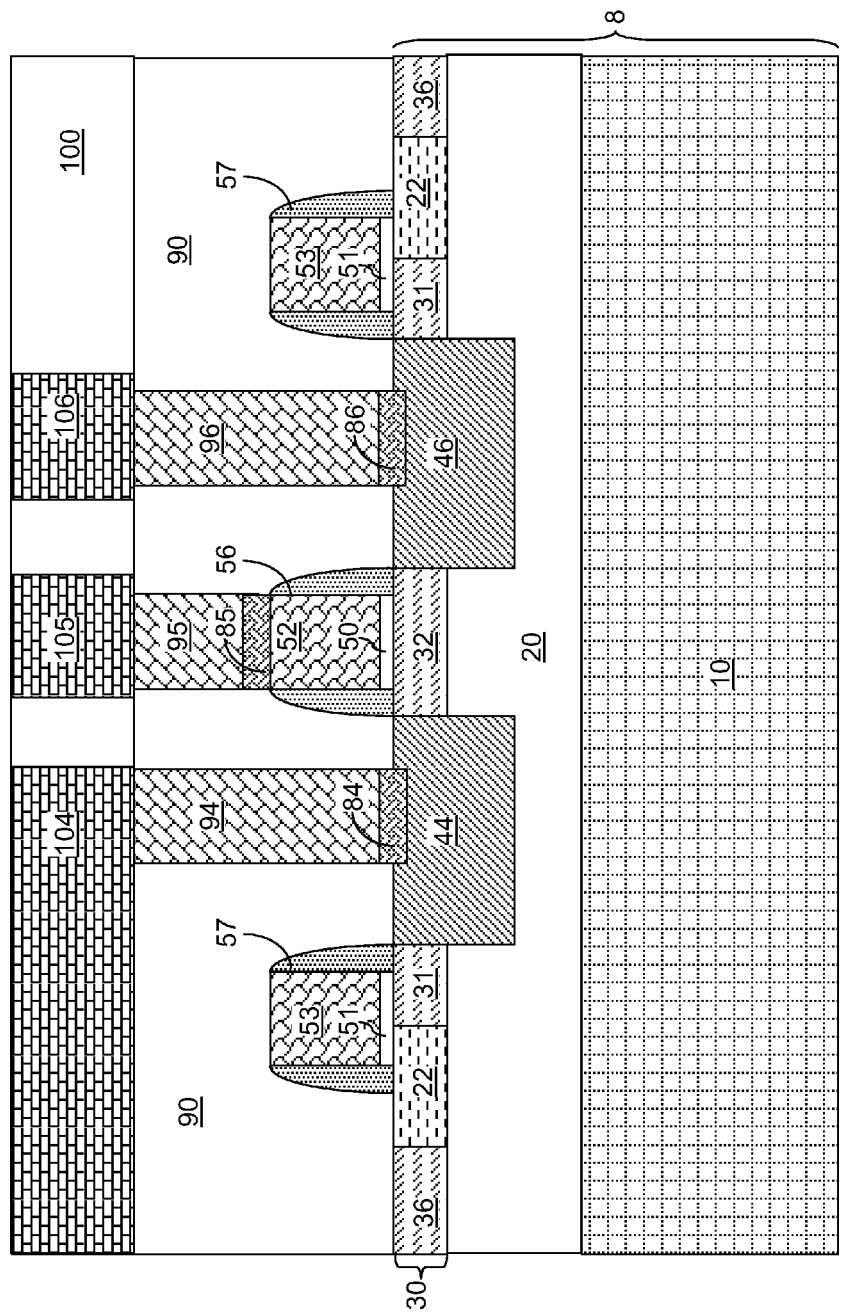
FIG. 5A is a vertical cross-sectional view of the first exemplary semiconductor structure after formation of contact structures and interconnect line structures according to the first embodiment of the present disclosure.
Figure 5B:
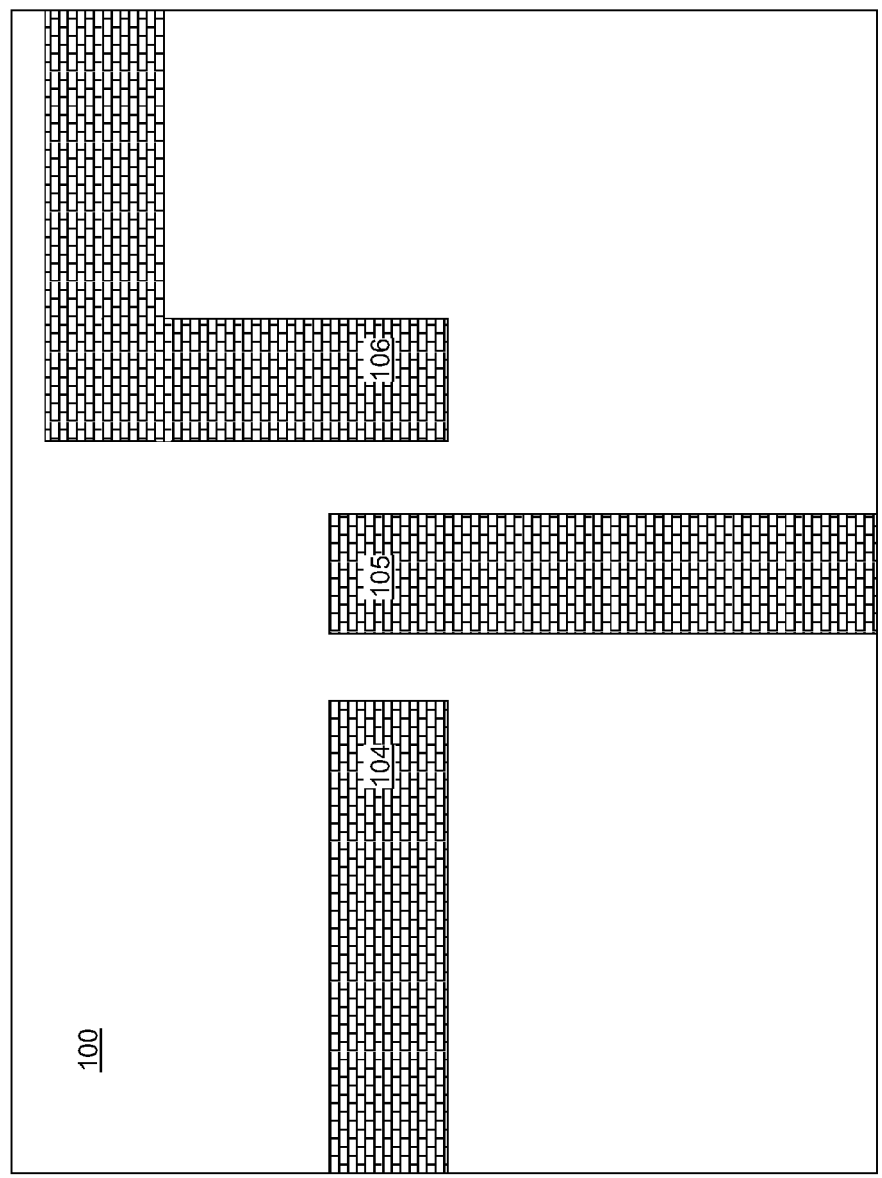
FIG. 5B is a top-down view of the first exemplary semiconductor structure of FIG. 5A.

Referring to FIGS. 5A and 5B, a contact-level dielectric layer 90 including a dielectric material is deposited. The contact-level dielectric layer 90 includes a dielectric material such as organosilicate glass, silicon nitride, and/or doped or undoped silicon oxide. The contact-level dielectric layer 90 can be deposited, for example, by chemical vapor deposition (CVD) or spin coating. The thickness of the contact-level dielectric layer 90 can be from 100 nm to 1,000 nm, although lesser and greater thicknesses can also be employed.

Various contact structures are formed within the contact-level dielectric layer 90 by forming openings within the contact-level dielectric layer 90, filling the openings with a conductive material, and removing excess conductive material above the top surface of the contact-level dielectric layer 90. The various contact structures can include a source-side contact via structure 94, a drain-side contact via structure 96, and a gate-side contact via structure 95.

In addition, various metal semiconductor alloy portions can be formed at the bottom of each opening within the contact-level dielectric layer 90 prior to forming the various contact structures (94, 96, 95). For example, the various metal semiconductor alloy portions can include a source-side metal semiconductor alloy portion 84, a drain-side metal semiconductor alloy portion 86, and a gate-side metal semiconductor alloy portion 85. The gate cap dielectric 58 and the at least one dummy gate cap dielectric 59 can be removed prior to formation of the various metal semiconductor alloy portions (84, 85, 86).

At least one interconnect-level dielectric layer 100 can be formed over the contact-level dielectric layer 90 and the various contact via structures (94, 96, 95) embedded therein. Various metal interconnect structures (104, 106, 105) that are conductively connected to the various contact via structures (94, 96, 95) can be formed in the at least one interconnect-level dielectric layer 100.

The field effect transistor in the first exemplary semiconductor structure includes a source region, i.e., the source-side embedded single crystalline semiconductor material region 44, which is thicker than the thickness of the top semiconductor layer 30 and is not significantly raised above the top surface of the top semiconductor layer 30. Further, the field effect transistor in the first exemplary semiconductor structure includes a drain region, i.e., the drain-side embedded single crystalline semiconductor material region 46, which is thicker than the thickness of the top semiconductor layer 30 and is not significantly raised above the top surface of the top semiconductor layer 30. The top surfaces of the source-side embedded single crystalline semiconductor material region 44 and the drain-side embedded single crystalline semiconductor material region 46 can be coplanar with, raised above, or recessed below, the interface between the gate dielectric 50 and the first single crystalline semiconductor material region 32.

The height of the top surfaces of the source-side embedded single crystalline semiconductor material region 44 and the drain-side embedded single crystalline semiconductor material region 46 can be selected to maintain the parasitic capacitive coupling between the gate electrode 52 and each of the source-side embedded single crystalline semiconductor material region 44 and the drain-side embedded single crystalline semiconductor material region 46. In one embodiment, the top surfaces of the source-side embedded single crystalline semiconductor material region 44 and the drain-side embedded single crystalline semiconductor material region 46 can be coplanar with, or recessed below, the interface between the gate dielectric 50 and the first single crystalline semiconductor material region 32. Thus, the parasitic capacitive coupling in the field effect transistor of the first exemplary semiconductor structure is not greater than the parasitic capacitive coupling in a field effect transistor that does not include a raised source and drain, while at the same time offering a low source resistance and a low drain resistance through the increased thickness of the source region and the drain region in the field effect transistor of the first exemplary semiconductor structure.

Figure 6A:
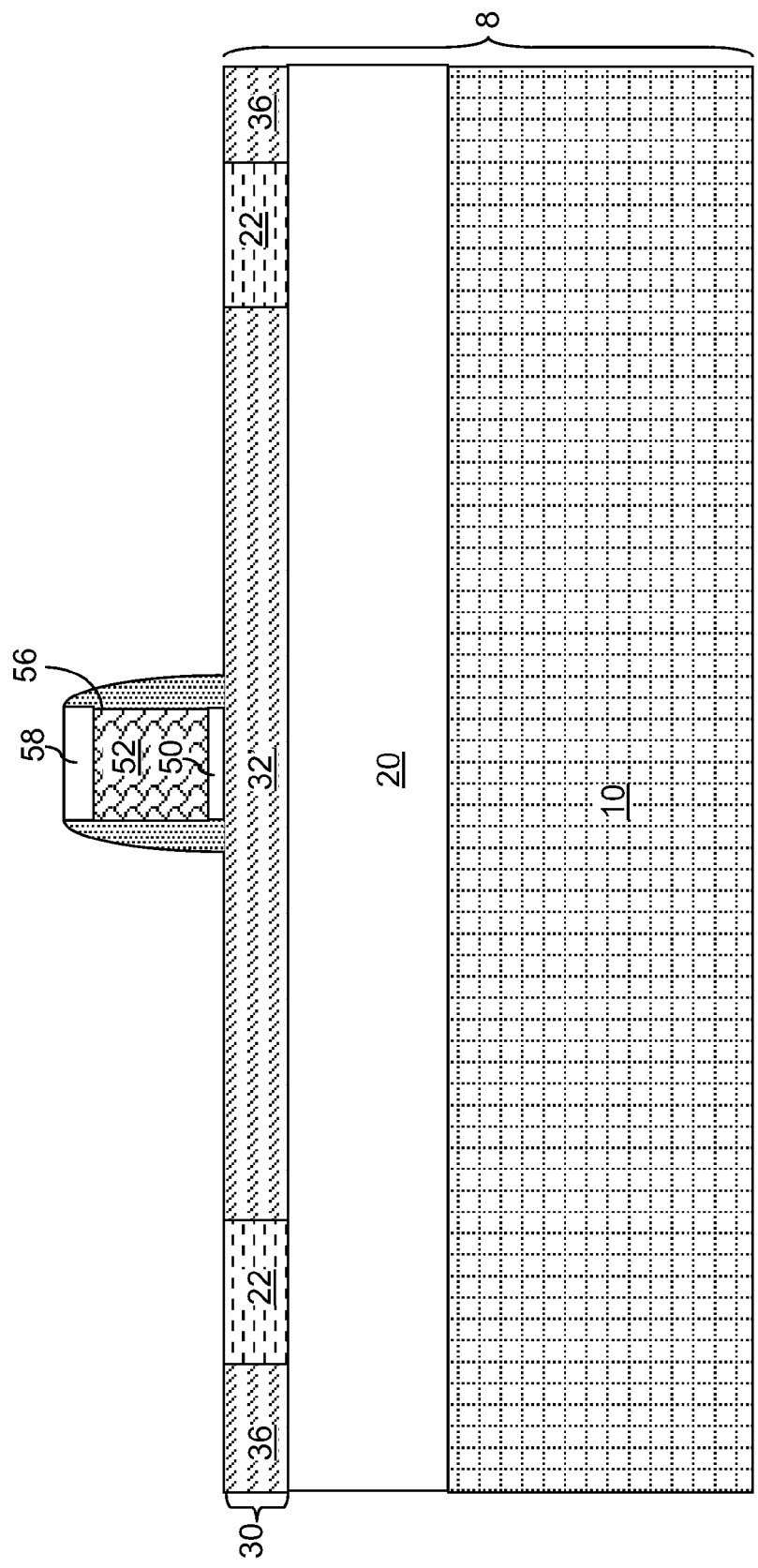
FIG. 6A is vertical cross-sectional view of a second exemplary semiconductor structure after formation of a gate stack and a gate spacer according to the second embodiment of the present disclosure.
Figure 6B:
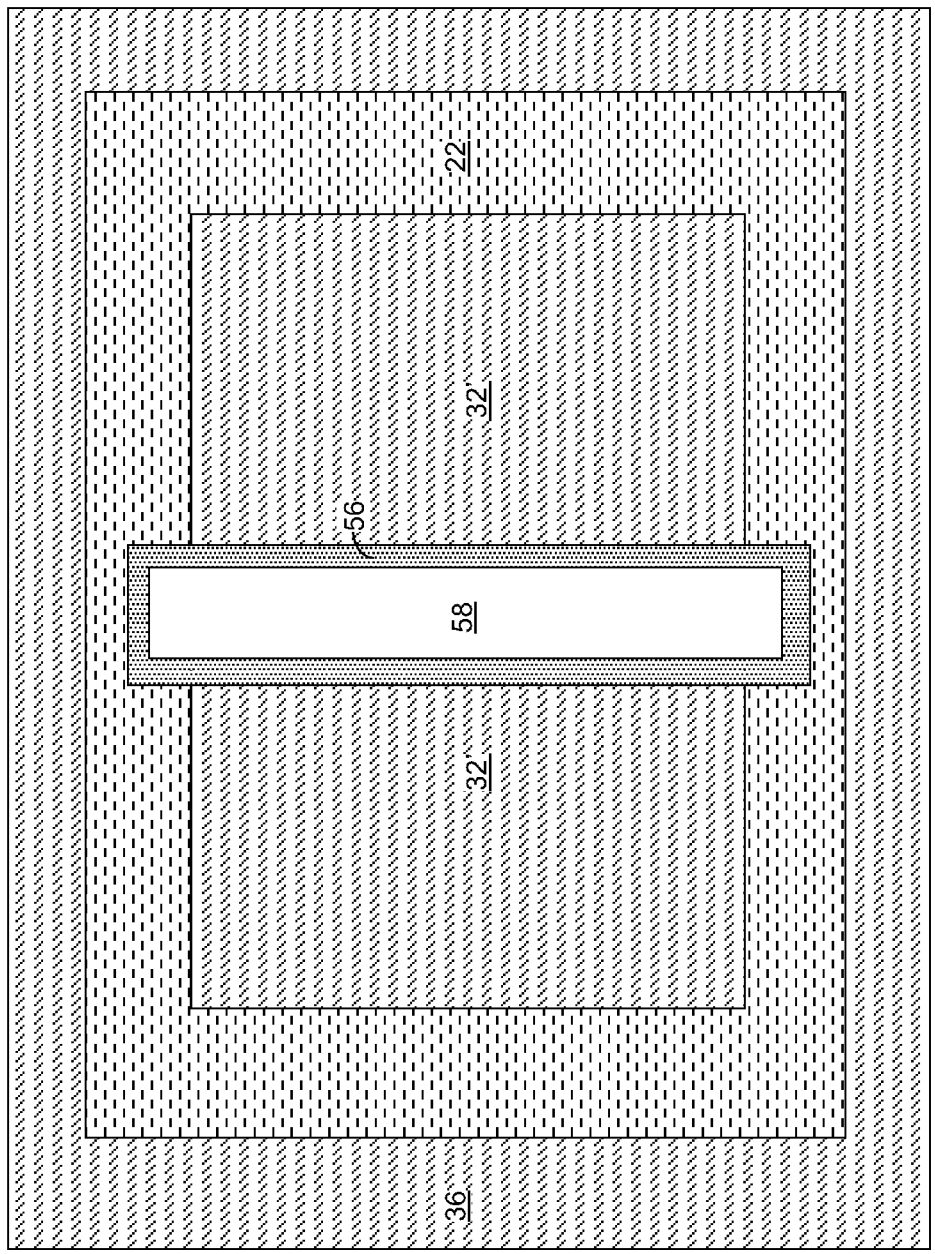
FIG. 6B is a top-down view of the second exemplary semiconductor structure of FIG. 6A.

Referring to FIGS. 6A and 6B, a second exemplary semiconductor structure according to the second embodiment of the present disclosure can be derived from the first exemplary semiconductor structure of FIGS. 1A and 1B by performing the processing steps of FIGS. 2A and 2B without forming any dummy gate stack (51, 53; See FIGS. 2A and 2B) or any dummy gate spacer (57; See FIGS. 2A and 2B).

Figure 7A:
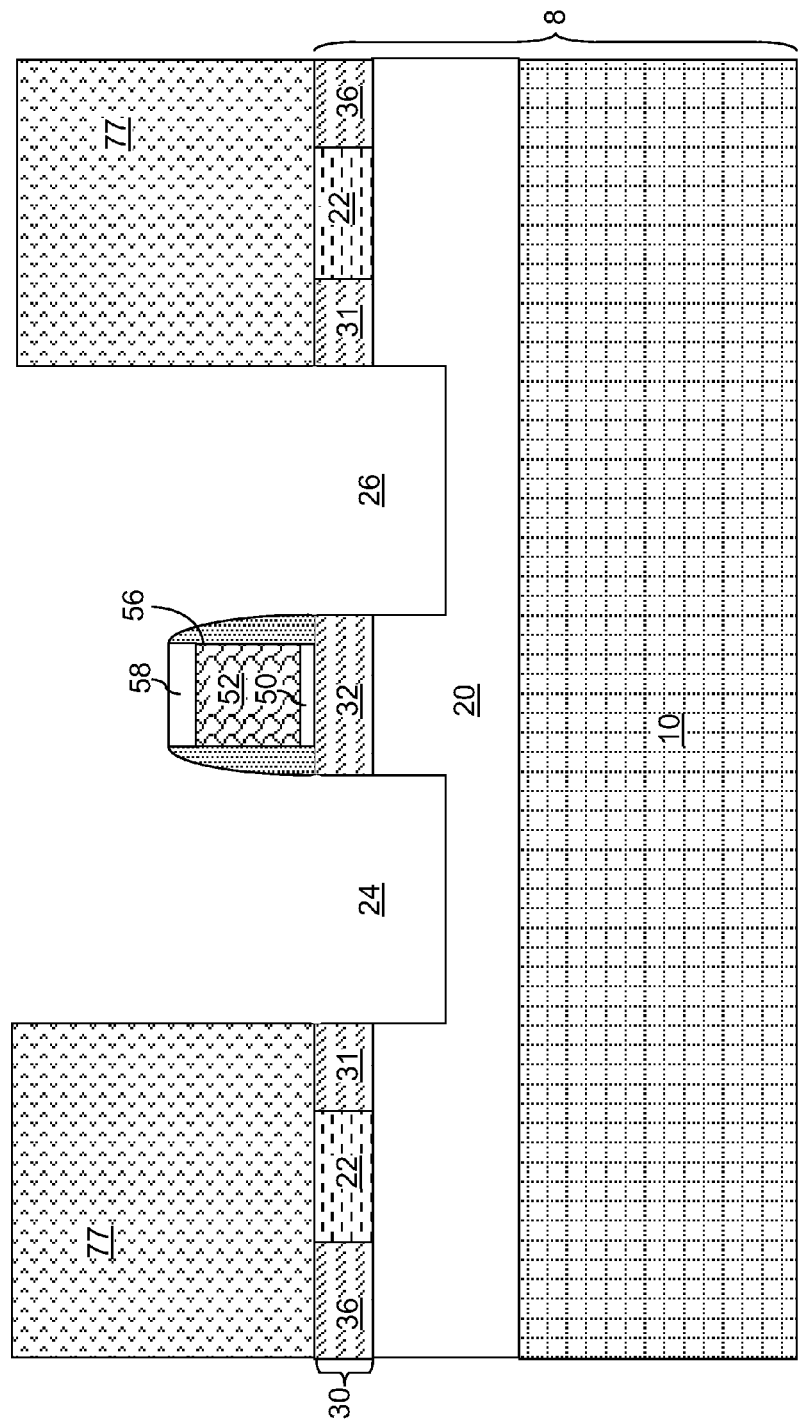
FIG. 7A is a vertical cross-sectional view of the second exemplary semiconductor structure after forming a source trench and a drain trench by etching portions of a top semiconductor layer and an upper portion of the buried single crystalline rare earth oxide layer that are not covered by the combination of the gate stack, the gate spacer, and a patterned photoresist according to the second embodiment of the present disclosure.
Figure 7B:
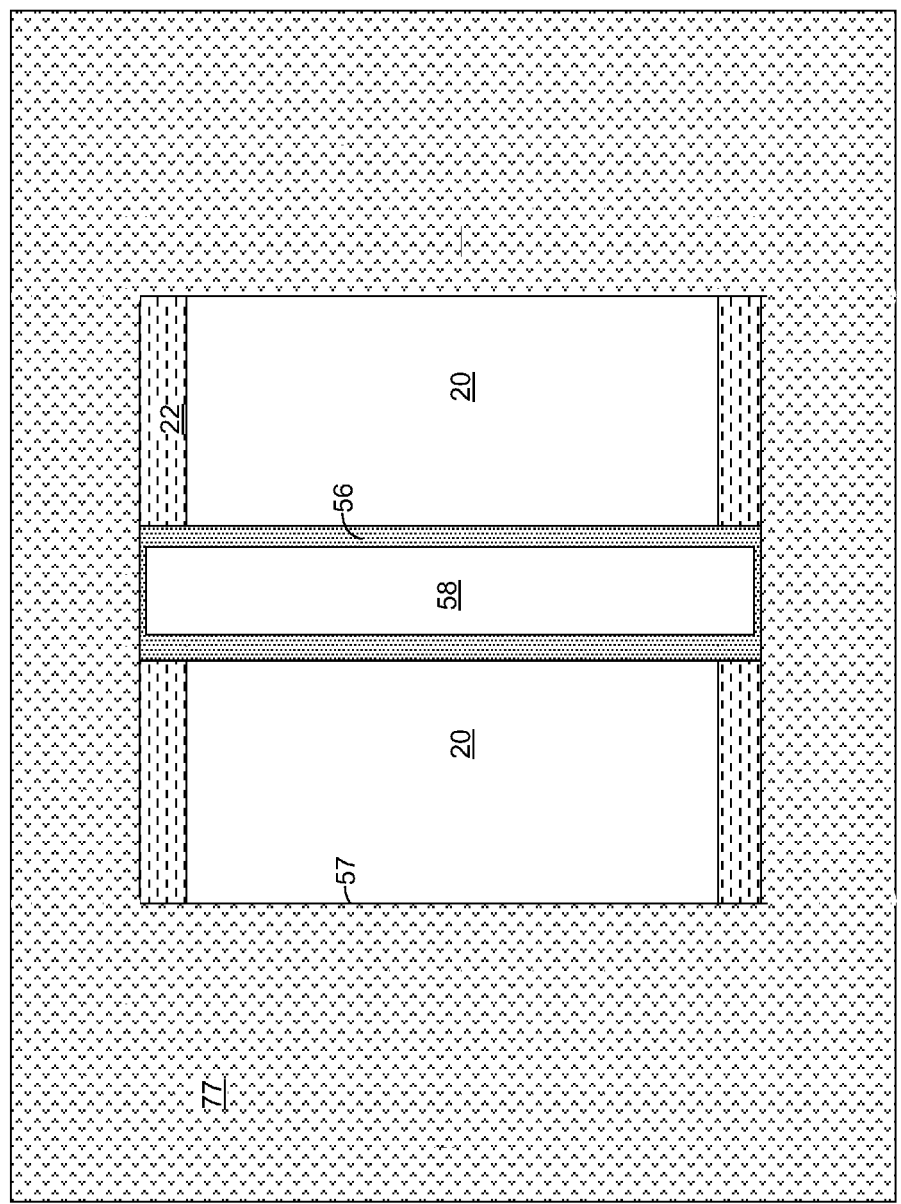
FIG. 7B is a top-down view of the second exemplary semiconductor structure of FIG. 7A.

Referring to FIGS. 7A and 7B, the same processing steps are performed as in FIGS. 3A and 3B in the first embodiment with the modification that the edges of the photoresist 77 is laterally shifted to overlie the contiguous single crystalline semiconductor material region 32'.

Figure 8A:
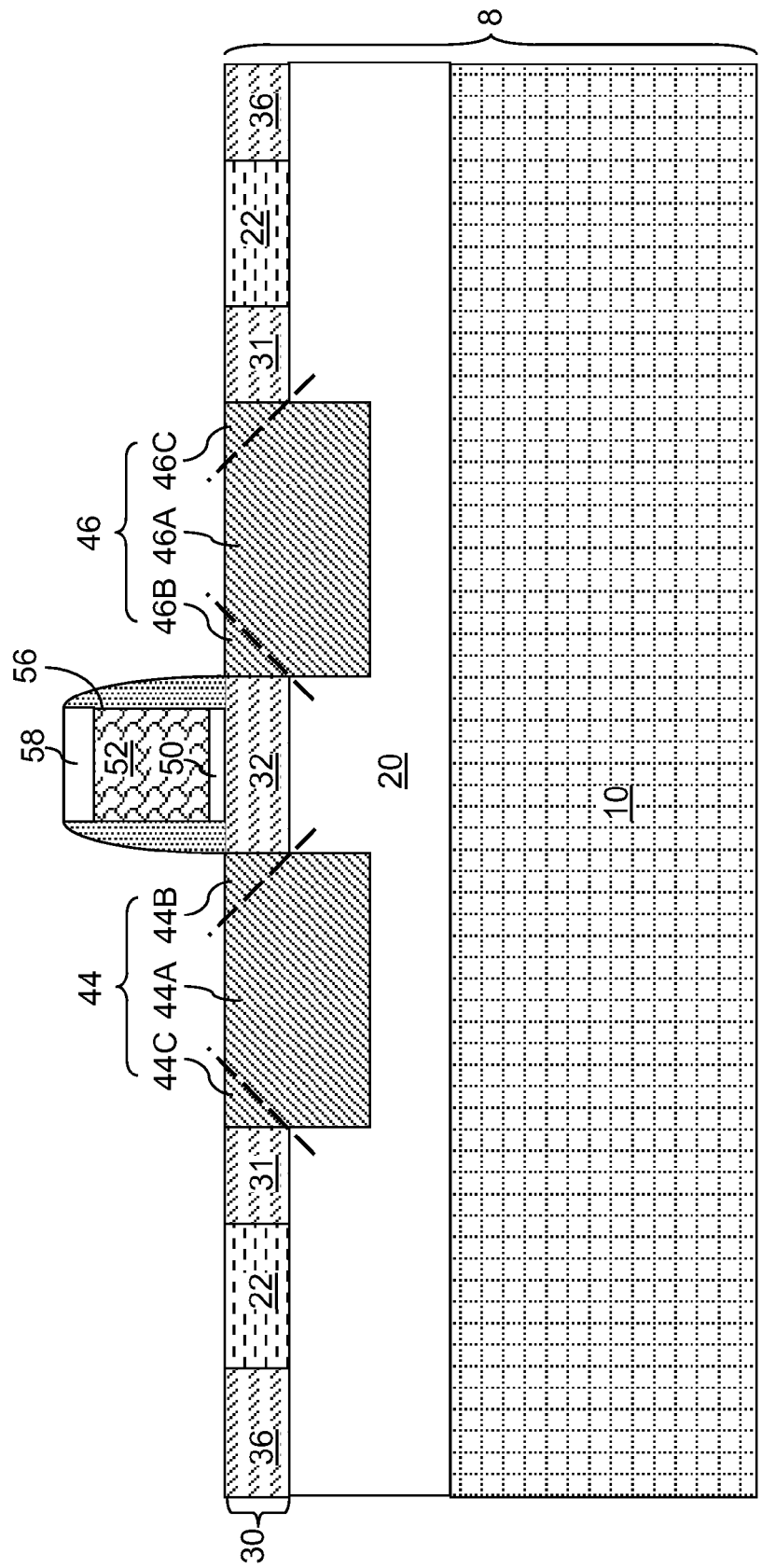
FIG. 8A is a vertical cross-sectional view of the second exemplary semiconductor structure after epitaxial growth of embedded single crystalline semiconductor portions on the recessed surfaces of the buried single crystalline rare earth oxide layer to form a recessed source region and a recessed drain region according to the second embodiment of the present disclosure.
Figure 8B:
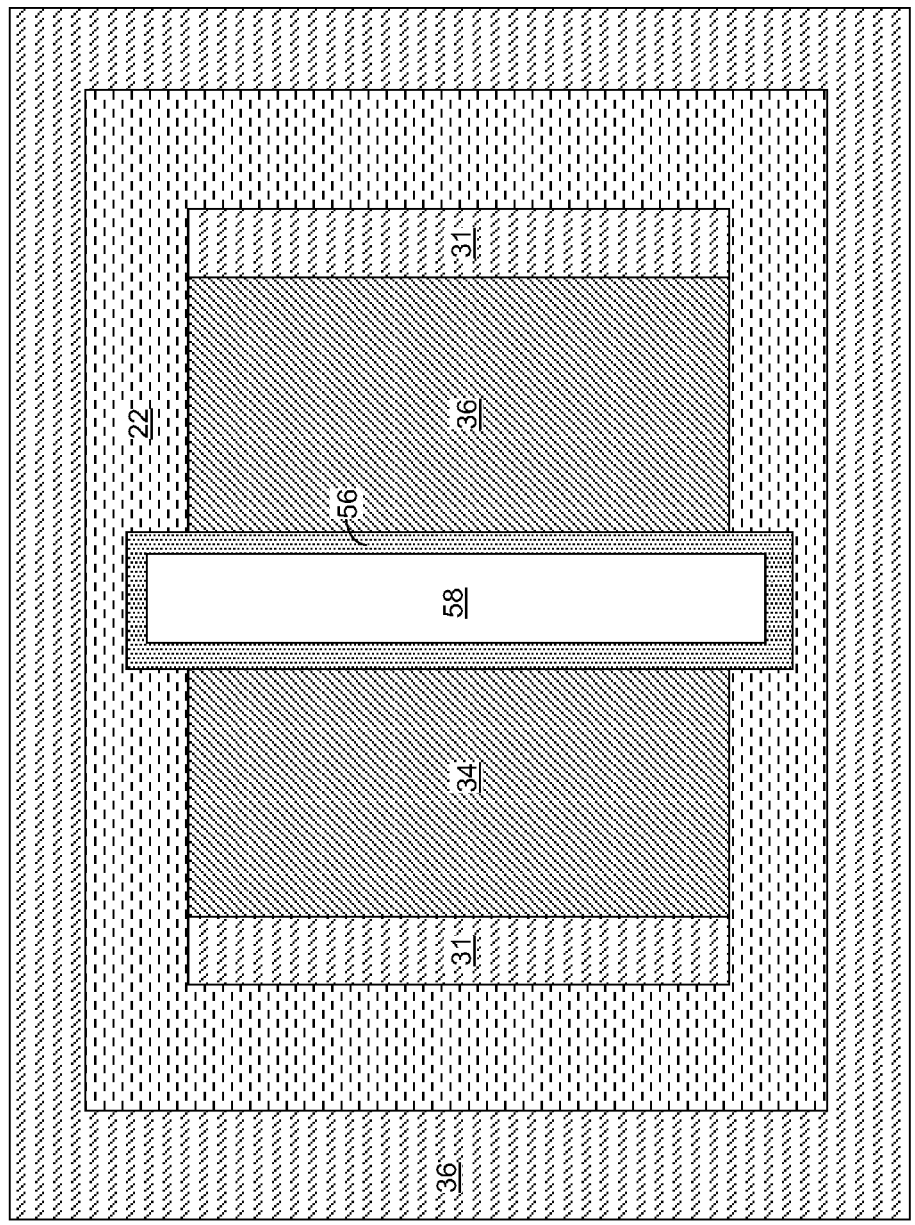
FIG. 8B is a top-down view of the second exemplary semiconductor structure of FIG. 8A.

Referring to FIGS. 8A and 8B, the processing steps of FIGS. 4A and 4B in the first embodiment are performed. Alternatively, the processing steps for the variation of the first embodiment are performed. A source-side embedded single crystalline semiconductor material region 44 and a drain-side embedded single crystalline semiconductor material region 46 are formed. The difference between the second exemplary semiconductor structure of FIGS. 8A and 8B and the first exemplary semiconductor structure of FIGS. 4A and 4B is that a dummy gate electrode and a dummy gate spacer do not exist in the second exemplary semiconductor structure, and therefore, an edge of the source-side embedded single crystalline semiconductor material region 44 or an edge of the drain-side embedded single crystalline semiconductor material region 46 are not vertically coincident with any outer sidewall of a dummy gate spacer.

Figure 9A:
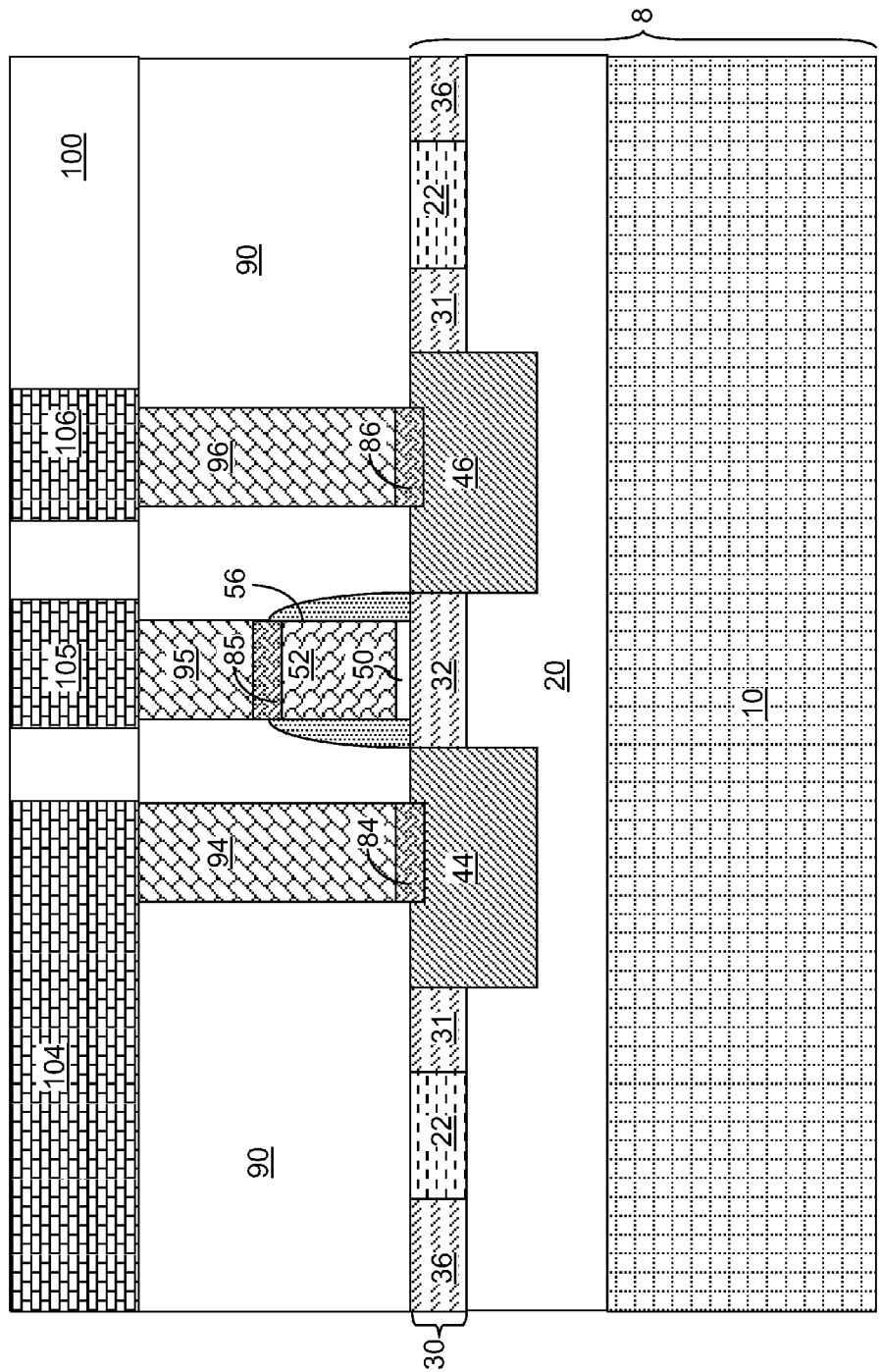
FIG. 9A is a vertical cross-sectional view of the second exemplary semiconductor structure after formation of contact structures and interconnect line structures according to the second embodiment of the present disclosure.
Figure 9B:
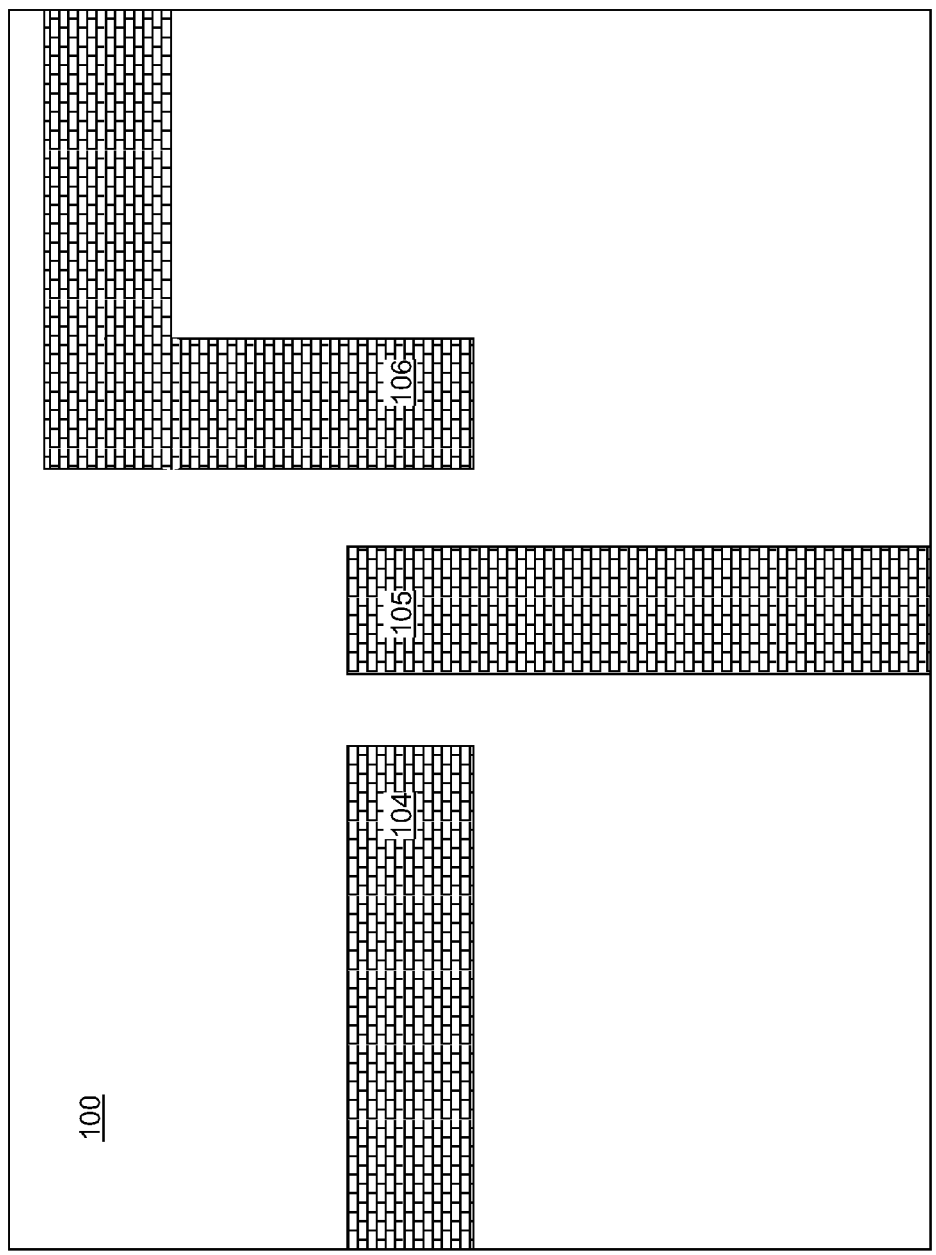
FIG. 9B is a top-down view of the second exemplary semiconductor structure of FIG. 9A.

Referring to FIGS. 9A and 9B, the processing steps of FIGS. 5A and 5B are performed to form a contact-level dielectric layer 90, various contact structures (94, 96, 95), various metal semiconductor alloy portions (84, 86, 85), at least one interconnect-level dielectric layer 100, and various metal interconnect structures (104, 106, 105).

The field effect transistor in the second exemplary semiconductor structure includes a source region which is thicker than the thickness of the top semiconductor layer 30 and is not significantly raised above the top surface of the top semiconductor layer 30. Further, the field effect transistor in the first exemplary semiconductor structure includes a drain region which is thicker than the thickness of the top semiconductor layer 30 and is not significantly raised above the top surface of the top semiconductor layer 30. The top surfaces of the source-side embedded single crystalline semiconductor material region 44 and the drain-side embedded single crystalline semiconductor material region 46 can be coplanar with, raised above, or recessed below, the interface between the gate dielectric 50 and the first single crystalline semiconductor material region 32. The parasitic capacitive coupling in the field effect transistor of the second exemplary semiconductor structure is not greater than the parasitic capacitive coupling in a field effect transistor that does not include a raised source and drain, while at the same time offering a low source resistance and a low drain resistance through the increased thickness of the source region and the drain region in the field effect transistor of the first exemplary semiconductor structure.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of forming a semiconductor structure comprising:
   forming at least one trench through a top semiconductor layer and into an upper portion of a buried single crystalline rare earth oxide layer in a semiconductor substrate; and
   forming at least one embedded single crystalline semiconductor material region by filling each of said at least one trench with a single crystalline semiconductor material region that includes a portion that is epitaxially aligned to a crystal structure of said buried single crystalline rare earth oxide layer, wherein each of said at least one embedded single crystalline semiconductor material region laterally contacts a single crystalline semiconductor material region located within said top semiconductor layer.

2. The method of claim 1, further comprising:
   forming a gate stack including a gate dielectric and a gate electrode on a top surface of said top semiconductor layer; and
   forming a gate spacer on sidewalls of said gate stack and said top surface of said top semiconductor layer, wherein said trench is formed by an anisotropic etch that employs said gate stack and said gate spacer as a part of an etch mask.

3. The method of claim 2, wherein said single crystalline semiconductor material region underlies said gate stack and said gate spacer, and a vertical interface between said single crystalline semiconductor material region and one of said at least one embedded single crystalline semiconductor material region is vertically coincident with a bottom portion of an outer sidewall of said gate spacer.

4. The method of claim 2, wherein said at least one trench comprises a source-side trench formed on one side of said gate stack and a drain-side trench formed on an opposite side of said gate stack, and said at least one embedded single crystalline semiconductor material portion comprises a source region filling said source-side trench and a drain region filling said drain-side trench.

5. The method of claim 1, further comprising forming a shallow trench isolation structure that contacts a topmost surface of said buried single crystalline rare earth oxide layer and laterally surrounds said single crystalline semiconductor material region and an upper portion of each of said at least one embedded single crystalline semiconductor material region.

6. The method of claim 1, wherein said single crystalline semiconductor material region is not in epitaxial alignment with said crystal structure of said buried single crystalline rare earth oxide layer, and said embedded single crystalline semiconductor material region includes:
- a first epitaxial portion that is the same as said portion of said embedded single crystalline semiconductor material region; and
- a second epitaxial portion that is in epitaxial alignment with said single crystalline semiconductor material region and not in epitaxial alignment with said first epitaxial portion.

7. The method of claim 1, wherein said buried single crystalline rare earth oxide layer comprises a single crystalline rare earth oxide selected from $Er_2O_3$, $Gd_2O_3$, $Nd_2O_3$, $Pr_2O_3$, $La_2O_3$, and a single crystalline alloy thereof.

8. The method of claim 1, wherein said buried single crystalline rare earth oxide layer has a bottommost surface located directly on an upper surface of a handle substrate.

9. The method of claim 1, wherein said forming at least one trench through said top semiconductor layer and into said upper portion of said buried single crystalline rare earth oxide layer comprises lithography and etching, wherein said etching includes an anisotropic etch.

10. The method of claim 1, wherein said forming said at least one embedded single crystalline semiconductor material region comprises a selective deposition process.

11. The method of claim 10, wherein said selective deposition process comprises flowing an etchant gas concurrently with a reactant gas.

12. The method of claim 11, wherein said reactant gas is selected from one of $SiH_4$, $SiH_2Cl_2$, $SiHCl_3$, $SiCl_4$, $Si_2H_6$, $GeH_4$, $Ge_2H_6$, $C_2H_2$, and $C_2H_4$.

13. The method of claim 1, wherein said top semiconductor layer comprises a single crystalline semiconductor material.

14. The method of claim 1, wherein, prior to forming said at least one trench, a stack of, from bottom to top, a handle substrate, said buried single crystalline rare earth oxide layer, and said top semiconductor layer is provided by:
- providing a semiconductor substrate including a single crystalline semiconductor layer having a same composition as said top semiconductor layer;
- forming a hydrogen-implanted layer in the single crystalline semiconductor layer at a depth equal to a desired thickness for said top semiconductor layer;
- depositing a layer of a single crystalline rare earth oxide material having a same thickness as a desired thickness for said top semiconductor layer;
- bonding said substrate including the hydrogen-implanted layer and said layer of said single crystalline rare earth oxide material to said handle substrate; and
- separating the bonded substrate along the hydrogen-implanted layer.

15. The method of claim 1, wherein, prior to forming said at least one trench, a stack of, from bottom to top, a handle substrate, said buried single crystalline rare earth oxide layer, and said top semiconductor layer is provided by:
- providing a semiconductor substrate including a single crystalline semiconductor layer having a same composition as said top semiconductor layer;
- forming a hydrogen-implanted layer in the single crystalline semiconductor layer at a depth equal to a desired thickness for said top semiconductor layer;
- bonding a layer of a single crystalline rare earth oxide material having a same thickness as a desired thickness for said top semiconductor layer;
- bonding said substrate including the hydrogen-implanted layer and said layer of said single crystalline rare earth oxide material to said handle substrate; and
- separating the bonded substrate along the hydrogen-implanted layer.

* * * * *